(12) United States Patent
Yamaha et al.

(10) Patent No.: US 9,666,287 B2
(45) Date of Patent: May 30, 2017

(54) VOLTAGE DETECTOR, METHOD FOR SETTING REFERENCE VOLTAGE AND COMPUTER READABLE MEDIUM

(71) Applicant: Asahi Kasei Microdevices Corporation, Tokyo (JP)

(72) Inventors: Yoshiro Yamaha, Tokyo (JP); Satoshi Takehara, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 15/140,639

(22) Filed: Apr. 28, 2016

(65) Prior Publication Data

US 2016/0240258 A1 Aug. 18, 2016

Related U.S. Application Data

(63) Continuation of application No. PCT/JP2014/080107, filed on Nov. 13, 2014.

(30) Foreign Application Priority Data

Nov. 15, 2013 (JP) ................................. 2013-237094

(51) Int. Cl.
*G11C 16/06* (2006.01)
*G11C 16/10* (2006.01)
(Continued)

(52) U.S. Cl.
CPC .............. *G11C 16/10* (2013.01); *G11C 5/147* (2013.01); *G11C 16/0408* (2013.01);
(Continued)

(58) Field of Classification Search
CPC . G11C 16/20; G11C 16/0408; H01L 29/7883; H01L 29/0883
See application file for complete search history.

(56) References Cited

U.S. PATENT DOCUMENTS 4,258,310 A * 3/1981 Asakawa ......... G01R 19/16571
257/E27.06
4,742,253 A 5/1988 Giebel
(Continued)

FOREIGN PATENT DOCUMENTS

JP S50-105042 A 8/1975
JP S58-169925 A 10/1983
(Continued)

OTHER PUBLICATIONS

International Search Report dated Feb. 10, 2015 for International Application No. PCT/JP2014/080107.
(Continued)

*Primary Examiner* — Pho M Luu
(74) *Attorney, Agent, or Firm* — Morgan, Lewis & Bockius LLP

(57) ABSTRACT

A voltage detector for detecting whether an input voltage is no lower than a predetermined threshold voltage, includes a reference voltage generator configured to generate a reference voltage, and a comparator configured to receive the input voltage and the reference voltage and to detect whether the input voltage is no lower than the threshold voltage that is determined by the reference voltage. Here, the reference voltage generator includes a first write MOS transistor, a second write MOS transistor, a first output MOS transistor and a second output MOS transistor each including a control gate and a floating gate.

19 Claims, 32 Drawing Sheets

(51) Int. Cl.
    *H01L 27/11517*    (2017.01)
    *H03K 5/08*    (2006.01)
    *G11C 16/04*    (2006.01)
    *H01L 27/088*    (2006.01)
    *H01L 29/788*    (2006.01)
    *G11C 5/14*    (2006.01)
    *G11C 16/30*    (2006.01)
    *H01L 21/28*    (2006.01)
    *G01R 19/165*    (2006.01)

(52) U.S. Cl.
    CPC .......... *G11C 16/0425* (2013.01); *G11C 16/30* (2013.01); *H01L 27/0883* (2013.01); *H01L 27/11517* (2013.01); *H01L 29/7883* (2013.01); *H03K 5/082* (2013.01); *G01R 19/16576* (2013.01); *H01L 21/28273* (2013.01)

(56) References Cited

U.S. PATENT DOCUMENTS 5,838,040 A     11/1998    Salter, III et al.
8,749,224 B2 *   6/2014    Matsushita ...... G01R 19/16528
                                                 324/76.11
8,836,683 B2 *   9/2014    Kim .......................... G05F 1/46
                                                 307/64

FOREIGN PATENT DOCUMENTS

| JP | S59-068027 A | 4/1984 |
| JP | H1-109917 A | 4/1989 |
| JP | H10-294381 A | 11/1998 |
| JP | H11-068538 A | 3/1999 |
| JP | 2002-368107 A | 12/2002 |
| JP | 2013-246627 A | 12/2013 |

OTHER PUBLICATIONS

International Preliminary Report on Patentability dated May 25, 2016 for International Application No. PCT/JP2014/080107.

* cited by examiner

VOLTAGE DETECTOR, METHOD FOR SETTING REFERENCE VOLTAGE AND COMPUTER READABLE MEDIUM

The contents of the following Japanese patent applications are incorporated herein by reference:
No. 2013-237094 filed in Japan on Nov. 15, 2013, and
No. PCT/JP2014/080107 filed on Nov. 13, 2014

BACKGROUND

1. Technical Field

The present invention relates to a voltage detector, a method for setting a reference voltage and a computer readable medium. More particularly, the present invention relates to a voltage detector for detecting whether an input voltage is no lower than a predetermined threshold voltage, a method for setting a reference voltage and a computer readable medium.

2. Related Art

A voltage detector configured to detect whether an input voltage is no lower than a predetermined threshold voltage uses a reference voltage generator circuit to define the threshold voltage. It is known to use, as the reference voltage generator circuit, a circuit utilizing a depletion-mode MOS-FET and an enhancement-mode MOSFET (see, for example, Japanese Patent Application Publication No. 2002-368107).

The conventional reference voltage generator circuit has a fixed reference voltage. For this reason, the voltage detector using the reference voltage generator circuit is prevented from setting the threshold voltage at any desired level.

SUMMARY

Therefore, it is an object of an aspect of the innovations herein to provide a voltage detector, a method for setting a reference voltage and a computer readable medium, which are capable of overcoming the above drawbacks accompanying the related art. The above and other objects can be achieved by combinations described in the claims. A first aspect of the innovations may include a voltage detector for detecting whether an input voltage is no lower than a predetermined threshold voltage. The voltage detector includes a reference voltage generator configured to generate a reference voltage, and a comparator configured to receive the input voltage and the reference voltage and to detect whether the input voltage is no lower than the threshold voltage that is determined by the reference voltage. Here, the reference voltage generator includes a first write MOS transistor including a control gate and a floating gate, a second write MOS transistor connected in series with the first write MOS transistor, where the second write MOS transistor includes a control gate and a floating gate, a first output MOS transistor including a control gate and a floating gate that are electrically connected to the control gate and the floating gate of the first write MOS transistor, and a second output MOS transistor connected in series with the first output MOS transistor, where the second output MOS transistor includes a control gate and a floating gate that are electrically connected to the control gate and the floating gate of the second write MOS transistor. The first write MOS transistor and the second write MOS transistor are non-volatile storage elements each including a tunnel oxide film that allows electric charges to tunnel therethrough to be injected into the floating gate, and the first output MOS transistor and the second output MOS transistor are non-volatile storage elements each not including the tunnel oxide film and the reference voltage is output from a connection point between the first output MOS transistor and the second output MOS transistor.

A second aspect of the innovations may include a method for setting a reference voltage generator. The reference voltage generator includes a first write MOS transistor including a control gate and a floating gate, a second write MOS transistor connected in series with the first write MOS transistor, where the second write MOS transistor includes a control gate and a floating gate, a first output MOS transistor including a control gate and a floating gate that are electrically connected to the control gate and the floating gate of the first write MOS transistor, and a second output MOS transistor connected in series with the first output MOS transistor, where the second output MOS transistor includes a control gate and a floating gate that are electrically connected to the control gate and the floating gate of the second write MOS transistor. Here, the first write MOS transistor and the second write MOS transistor are non-volatile storage elements each including a tunnel oxide film through that allows electric charges to tunnel therethrough to be injected into the floating gate, and the first output MOS transistor and the second output MOS transistor are non-volatile storage elements not including the tunnel oxide film and a reference voltage is output from a connection point between the first output MOS transistor and the second output MOS transistor. After electric charges stored in the floating gates of the first write MOS transistor and the first output MOS transistor are set in a reference state, the second write MOS transistor and the second output MOS transistor enter an enhancement state in response to controlling the state of the electric charges stored in the floating gate through the tunnel oxide film of the second write MOS transistor, and the first write MOS transistor and the first output MOS transistor enter a depletion state in response to controlling the state of the electric charges stored in the floating gate through the tunnel oxide film of the first write MOS transistor.

A third aspect of the innovations may include a program configured for causing a computer to execute a method for setting a reference voltage. The method is to be used for setting a reference voltage generator, and the computer is configured to control the reference voltage generator. The reference voltage generator includes a first write MOS transistor including a control gate and a floating gate, a second write MOS transistor connected in series with the first write MOS transistor, where the second write MOS transistor includes a control gate and a floating gate, a first output MOS transistor including a control gate and a floating gate that are electrically connected to the control gate and the floating gate of the first write MOS transistor, and a second output MOS transistor connected in series with the first output MOS transistor, the second output MOS transistor including a control gate and a floating gate that are electrically connected to the control gate and the floating gate of the second write MOS transistor. The first write MOS transistor and the second write MOS transistor are non-volatile storage elements each including a tunnel oxide film that allows electric charges to tunnel therethrough to be injected into the floating gate, and the first output MOS transistor and the second output MOS transistor are non-volatile storage elements each not including the tunnel oxide film and a reference voltage is output from a connection point between the first output MOS transistor and the second output MOS transistor. Here, after electric charges stored in the floating gates of the first write MOS transistor and the first output MOS transistor are set in a reference state, the second write MOS transistor and the second output MOS transistor enter an enhancement state in response to controlling the state of the electric charges stored in the floating gate through the tunnel oxide film of the second write MOS transistor, and the first write MOS transistor and the first output MOS transistor enter a depletion state in response to controlling the state of the electric charges stored in the floating gate through the tunnel oxide film of the first write MOS transistor.

A fourth aspect of the innovations may include a voltage detector for detecting whether an input voltage is no lower than a predetermined threshold voltage. The voltage detector includes a reference voltage generator configured to generate a reference voltage corresponding to the threshold voltage, a voltage selector configured to select one of the reference voltage and a setting voltage used to measure the reference voltage to be generated by the reference voltage generator and outputs the selected voltage, and a comparator including a CMOS inverter, the comparator configured to receive, at an input terminal of the CMOS inverter, one of the setting voltage and the reference voltage selected by the voltage selector and to receive the input voltage at a power supply terminal of the CMOS inverter. Here, the voltage selector selects the setting voltage when the voltage detector operates in a reference voltage detection mode in which the voltage detector detects the reference voltage that is to be generated by the reference voltage generator for the threshold voltage, and selects the reference voltage when the voltage detector operates in an actual operation mode in which the voltage detector detects whether the input voltage is no lower than the threshold voltage.

A fifth aspect of the innovations may include a voltage detector, in which the reference voltage generator includes a first reference voltage generator configured to generate a first reference voltage that is equal to the setting voltage that is observed when the output from the CMOS inverter is inverted, in a case where the input voltage is equal to a predetermined first threshold voltage while the voltage detector operates in the reference voltage detection mode.

A sixth aspect of the innovations may include a voltage detector including a first reference voltage generator that includes a first write MOS transistor including a control gate and a floating gate, a second write MOS transistor connected in series with the first write MOS transistor, the second write MOS transistor including a control gate and a floating gate, a first output MOS transistor including a control gate and a floating gate that are electrically connected to the control gate and the floating gate of the first write MOS transistor, and a second output MOS transistor connected in series with the first output MOS transistor, the second output MOS transistor including a control gate and a floating gate that are electrically connected to the control gate and the floating gate of the second write MOS transistor. The first write MOS transistor and the second write MOS transistor are nonvolatile storage elements each including a tunnel oxide film that allows electric charges to tunnel therethrough to be injected into the floating gate, and the first output MOS transistor and the second output MOS transistor are nonvolatile storage elements each not including the tunnel oxide film and a first reference voltage is output from a connection point between the first output MOS transistor and the second output MOS transistor.

A seventh aspect of the innovations may include a voltage detector including a voltage selector configured to select a reference voltage when the voltage detector operates in a reference voltage setting mode according to which a first reference voltage is set in a first reference voltage generator.

An eighth aspect of the innovations may include a voltage detector further including a gate controller configured to, when the voltage detector operates in the reference voltage setting mode, control a state of electric charges stored in the floating gate of the first write MOS transistor in such a manner that the first reference voltage output from the first reference voltage generator becomes equal to the setting voltage detected while the voltage detector operates in the reference voltage detection mode.

A ninth aspect of the innovations may include a voltage detector further including a current mirror configured to, when the voltage detector operates in the reference voltage setting mode, generate an adjust current based on an external current input from outside the voltage detector, where the adjust current is smaller than the external current. Here, the gate controller inputs the adjust current into the second output MOS transistor to control the state of the electric charges stored in the floating gate of the second write MOS transistor in such a manner that the first reference voltage output from the first reference voltage generator becomes equal to a predetermined voltage, after which, while the adjust current is prevented from being input into the second output MOS transistor, the gate controller controls the state of the electric charges stored in the floating gate of the first write MOS transistor in such a manner that the first reference voltage output from the first reference voltage generator becomes equal to a predetermined voltage.

A tenth aspect of the innovations may include a voltage detector, in which the reference voltage generator further includes a second reference voltage generator configured to, when the input voltage is equal to a predetermined second threshold voltage different from the first reference voltage while the voltage detector operates in the reference voltage detection mode, generate a second reference voltage that is equal to the setting voltage observed when the output from the CMOS inverter is inverted.

An eleventh aspect of the innovations may include a method for setting a reference voltage generated by a reference voltage generator included in a voltage detector for detecting whether an input voltage is no lower than a predetermined threshold voltage. The voltage detector includes a reference voltage generator configured to generate a reference voltage corresponding to the threshold voltage, a voltage selector configured to select one of the reference voltage and a setting voltage used to measure the reference voltage to be generated by the reference voltage generator and outputs the selected voltage, and a comparator including a CMOS inverter, where the comparator is configured to receive, at an input terminal of the CMOS inverter, one of the setting voltage and the reference voltage selected by the voltage selector and to receive the input voltage at a power supply terminal of the CMOS inverter. Here, the voltage selector selects the setting voltage when the voltage detector operates in a reference voltage detection mode in which the voltage detector detects the reference voltage that is to be generated by the reference voltage generator for the threshold voltage, and selects the reference voltage when the voltage detector operates in an actual operation mode in which the voltage detector detects whether the input voltage is no lower than the threshold voltage. According to this method, the comparator includes the CMOS inverter, and the setting voltage used to detect the reference voltage is gradually changed to detect the setting voltage observed when the output from the CMOS inverter is inverted, and the detected setting voltage is set in the reference voltage generator as the reference voltage.

A twelfth aspect of the innovations may include a program configured to cause a computer to execute a method for setting a voltage detector for detecting whether an input voltage is no lower than a predetermined threshold voltage. The computer is configured to control a reference voltage generator in the voltage detector. The voltage detector includes a reference voltage generator configured to generate a reference voltage corresponding to the threshold voltage, a voltage selector configured to select one of the reference voltage and a setting voltage used to measure the reference voltage to be generated by the reference voltage generator and outputs the selected voltage, and a comparator including a CMOS inverter, where the comparator is configured to receive, at an input terminal of the CMOS inverter, one of the setting voltage and the reference voltage selected by the voltage selector and to receive the input voltage at a power supply terminal of the CMOS inverter. Here, the voltage selector selects the setting voltage when the voltage detector operates in a reference voltage detection mode in which the voltage detector detects the reference voltage that is to be generated by the reference voltage generator for the threshold voltage, and selects the reference voltage when the voltage detector operates in an actual operation mode in which the voltage detector detects whether the input voltage is no lower than the threshold voltage. According to this method, the comparator includes the CMOS inverter, and the setting voltage used to detect the reference voltage is gradually changed to detect the setting voltage observed when the output from the CMOS inverter is inverted, and the detected setting voltage is set in the reference voltage generator as the reference voltage.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
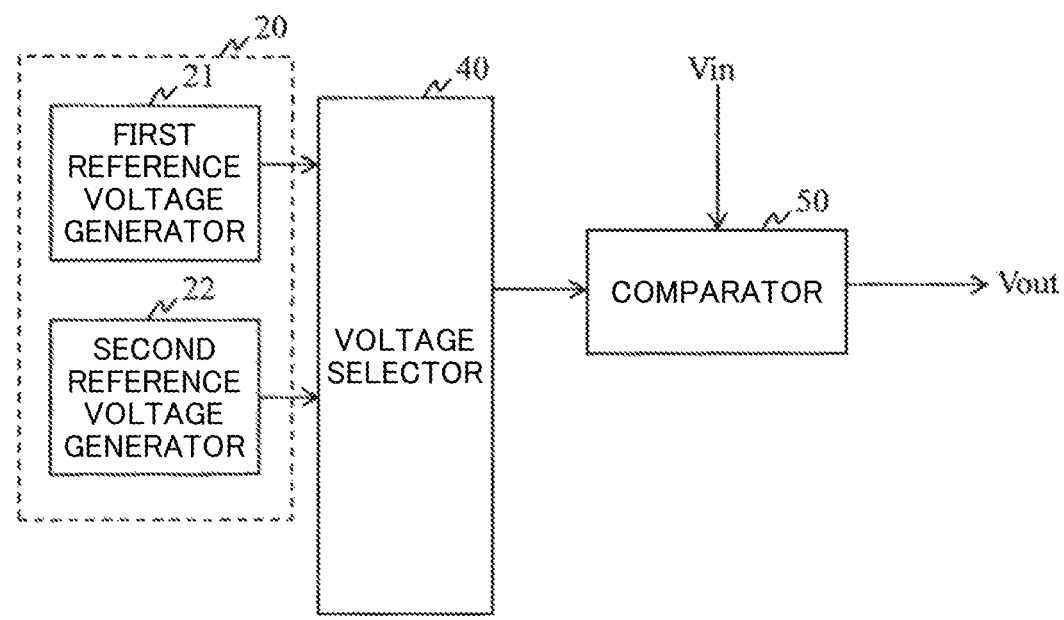
FIG. 1 schematically shows a voltage detector 100 relating to an embodiment of the present invention.

FIG. 1 schematically shows a voltage detector 100 relating to an embodiment of the present invention. The voltage detector 100 includes a reference voltage generator 20, a voltage selector 40 and a comparator 50. The voltage detector 100 is configured to detect whether an input voltage Vin is no lower than a predetermined target voltage.

The reference voltage generator 20 is configured to generate a reference voltage used to define the target voltage. The reference voltage generator 20 of the present exemplary embodiment includes a first reference voltage generator 21 and a second reference voltage generator 22, each of which includes a non-volatile storage element. The reference voltage generator 20 adjusts the reference voltages generated by the first reference voltage generator 21 and the second reference voltage generator 22, by adjusting the non-volatile storage elements. The first reference voltage generator 21 and the second reference voltage generator 22 generate reference voltages of different levels. As an alternative example of the present embodiment, one of the first reference voltage generator 21 and the second reference voltage generator 22 includes a non-volatile storage element, and the reference voltage is adjusted by adjusting the non-volatile storage element.

The first reference voltage generator 21 generates a reference voltage VrefH and outputs the reference voltage VrefH to the voltage selector 40. The second reference voltage generator 22 generates a reference voltage VrefL, which is lower than the reference voltage VrefH, and outputs the reference voltage VrefL to the voltage selector 40.

The voltage selector 40 selects one of the reference voltage VrefH and the reference voltage VrefL generated by the first reference voltage generator 21 and the second reference voltage generator 22 and input the selected reference voltage into the comparator 50. The comparator 50 detects whether the input voltage Vin is no lower than a target voltage, which is determined according to the reference voltage selected by the voltage selector 40. The output from the comparator 50 transitions depending on whether the input voltage Vin is no lower than the target voltage. In the present exemplary embodiment, the output from the comparator 50 is equal to a reference potential, which is for example the ground potential, when the input voltage Vin is lower than the target voltage. The output from the comparator 50 is substantially equal to the input voltage Vin when the input voltage Vin is no lower than the target voltage. As used herein, the phrase "the output from the comparator 50 is inverted" means that the output from the comparator 50 changes in level from the reference potential to the input voltage Vin or from the input voltage Vin to the reference potential.

The voltage selector 40 selects one of the reference voltage VrefH and the reference voltage VrefL according to the output from the comparator 50. In the present exemplary embodiment, when the comparator 50 outputs the reference potential, the voltage selector 40 selects the reference voltage VrefH. On the other hand, when the comparator 50 outputs the voltage substantially equal to the input voltage Vin, the voltage selector 40 selects the reference voltage VrefL. In this manner, the voltage detector 100 operates hysteretically.

Figure 2:
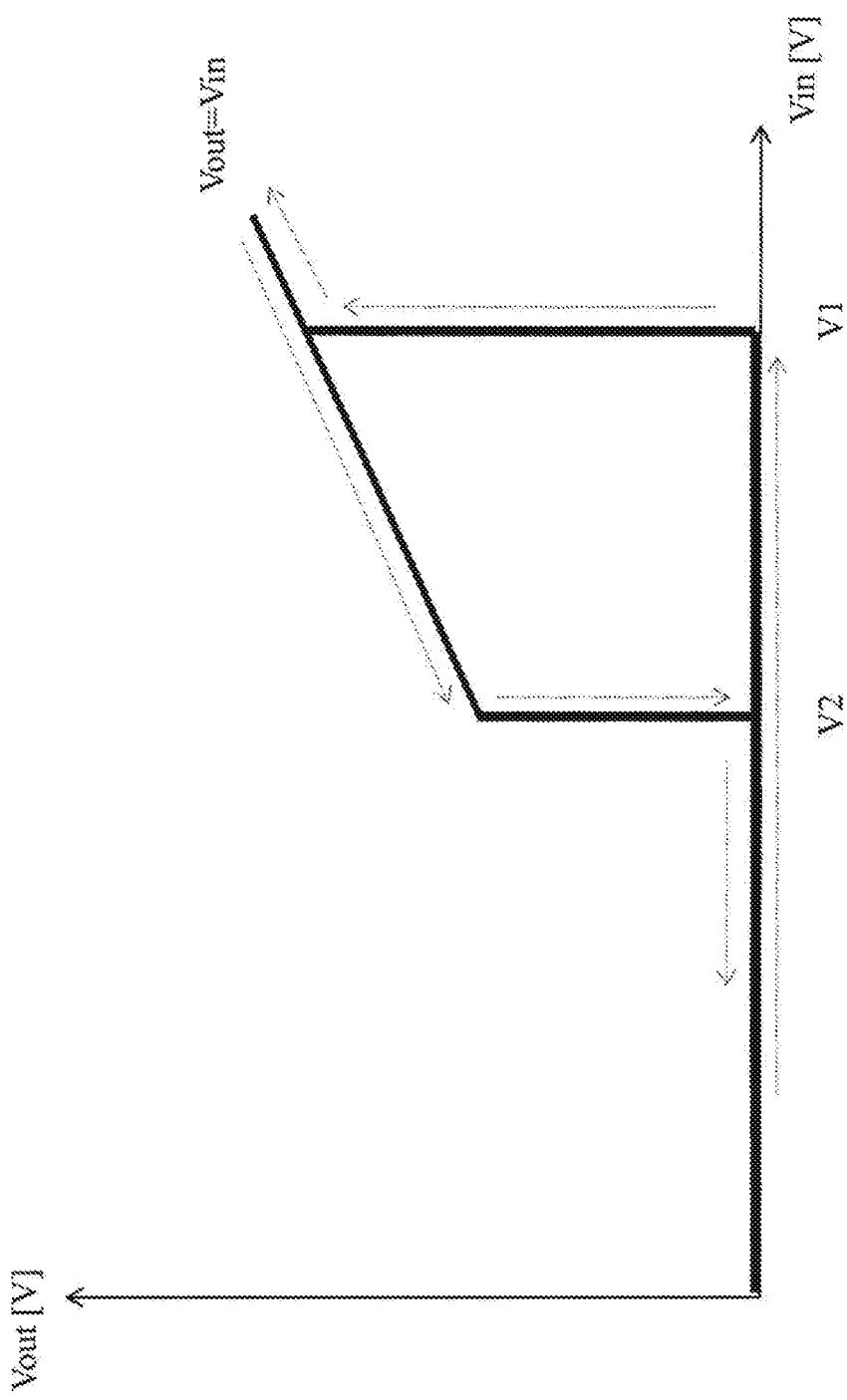
FIG. 2 shows, as an example, how the voltage detector 100 relating to the embodiment of the present invention operates.

FIG. 2 shows, as an example, how the voltage detector 100 relating to the embodiment of the present invention operates. The horizontal axis represents the input voltage Vin [V] input into the voltage detector 100 and the vertical axis represents the output voltage Vout [V] from the voltage detector 100.

As described above, the voltage detector 100 relating to the present exemplary embodiment operates hysteretically. In other words, the target voltage varies according to the output from the comparator 50 in the voltage detector 100. The voltage detector 100 relating to the present exemplary embodiment employs a first target voltage V1 when the comparator 50 outputs the reference potential and a second target voltage V2 when the comparator 50 outputs a voltage substantially equal to the input voltage Vin. The target voltages are appropriately determined in accordance with required specifications.

In a case where the input voltage Vin increases to reach the first target voltage V1 while the output voltage Vout from the comparator 50 is being equal to the reference potential, the output voltage Vout from the comparator 50 transitions to the voltage substantially equal to the input voltage Vin. On the other hand, in a case where the input voltage Vin decreases to reach the second target voltage V2 while the output voltage Vout from the comparator 50 is being substantially equal to the input voltage Vin, the output voltage Vout from the comparator 50 transitions to the voltage equal to the reference potential.

The voltage detector relating to the present embodiment as described above is in particular useful in the energy harvest technology. When the energy harvest technology uses voltage detectors, small energies are accumulated on capacitors until a sufficiently high voltage is reached, after which the accumulated energies are used to do work. Once energies are accumulated to reach the first target voltage V1, work can be done using the difference in voltage between the first target voltage V1 and the second target voltage V2. The difference in voltage V1–V2 differs depending on systems. Therefore, some embodiments of the present invention allow users to accomplish any desired system performance by arbitrarily setting the first target voltage V1 and the second target voltage V2. Thus, some embodiments of the present invention offer great advantages.

Figure 3:
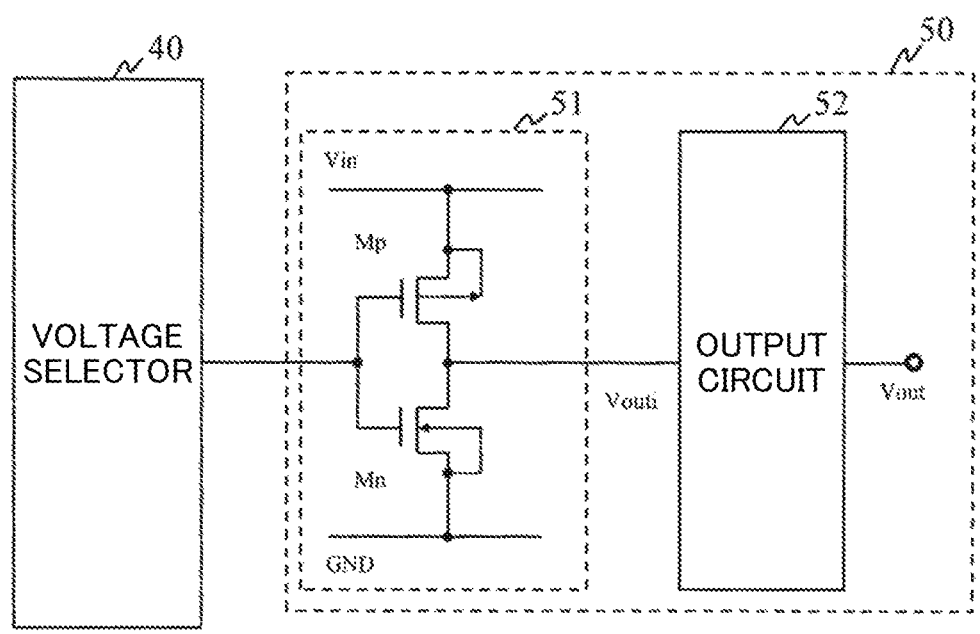
FIG. 3 shows an exemplary structure of the comparator 50.

FIG. 3 shows an exemplary structure of the comparator 50. The comparator 50 includes a CMOS inverter 51 and an output circuit 52. The comparator 50 operates as a switch according to the voltage VIN input into its power supply terminal and the reference voltage input into its input terminal. Here, the power supply terminal indicates the terminal connected to a source terminal of the CMOS inverter 51, and the input terminal indicates the terminal connected to the gate terminals of the CMOS inverter 51.

The CMOS inverter 51 includes CMOS transistors (Mp, Mn). The CMOS inverter 51 receives its input at its power supply terminals, and the input voltage Vin is input into the positive power supply terminal of the CMOS inverter 51 and GND is connected to the negative power supply terminal of the CMOS inverter 51. In the present exemplary embodiment, the positive power supply terminal of the CMOS inverter 51 is the terminal connected to the source of the CMOS transistor Mp, and the negative power supply terminal is the terminal connected to the source of the CMOS transistor Mn. In the present exemplary embodiment, the positive power supply terminal of the CMOS inverter 51 serves as an input voltage terminal into which the input voltage is input. The input terminal of the CMOS inverter 51 receives the reference voltage VrefH or VrefL selected by the voltage selector 40. As described above, the input terminal of the CMOS inverter 51 indicates the terminal connected to the gates of the CMOS transistors (Mp, Mn). The input terminal of the CMOS inverter 51 of the present exemplary embodiment serves as a reference voltage terminal into which the reference voltage is input.

The output circuit 52 outputs a voltage VOUT determined according to an output voltage Vouti output from the CMOS inverter 51. For example, the output circuit 52 may include a CMOS inverter multi-stage connected with the CMOS inverter 51, or another general output circuit. For example, the output circuit 52 may include a PMOS switch that switches whether to output the output voltage Vouti from the CMOS inverter 51, or an NMOS circuit whose source operates according to the output voltage Vouti from the CMOS inverter 51 and is connected to the ground potential. The output circuit 52 may include a plurality of types of output circuits and output terminals corresponding to the respective types of output circuits.

Whether the CMOS inverter 51 outputs the ground potential or the voltage substantially equal to the input voltage Vin is determined by whether the difference between the input voltage Vin and the reference voltage Vref is no lower than the threshold of the PMOS transistor Mp of the CMOS inverter 51. A point of time at which the output from the CMOS inverter 51 is inverted during its operation (the target voltage) can be adjusted by adjusting the reference voltage Vref. In the present exemplary embodiment, the voltage selector 40 selects one of the reference voltages VrefH and VrefL according to the output from the output circuit 52. This enables the target voltage to be varied according to the output from the output circuit 52. In this manner, the voltage detector 100 operates hysteretically as shown in FIG. 2.

The characteristics of the CMOS inverter 51 included in the comparator 50 determine the level of the reference voltage Vref that should be input into the comparator 50 in order to achieve the target voltage for which the voltage detector 100 should operate. Here, it should be noted that the CMOS inverter 51 shows variability in the point of time at which the output from the CMOS inverter 51 is inverted during its operation (the target voltage). Therefore, the reference voltage Vref is preferably determined taking into consideration the fact that the CMOS inverter 51 shows variability in the point of time at which the output from the CMOS inverter 51 is inverted during its operation (the target voltage) in order to allow the voltage detector 100 to operate for a highly accurately determined target voltage.

Figure 4:
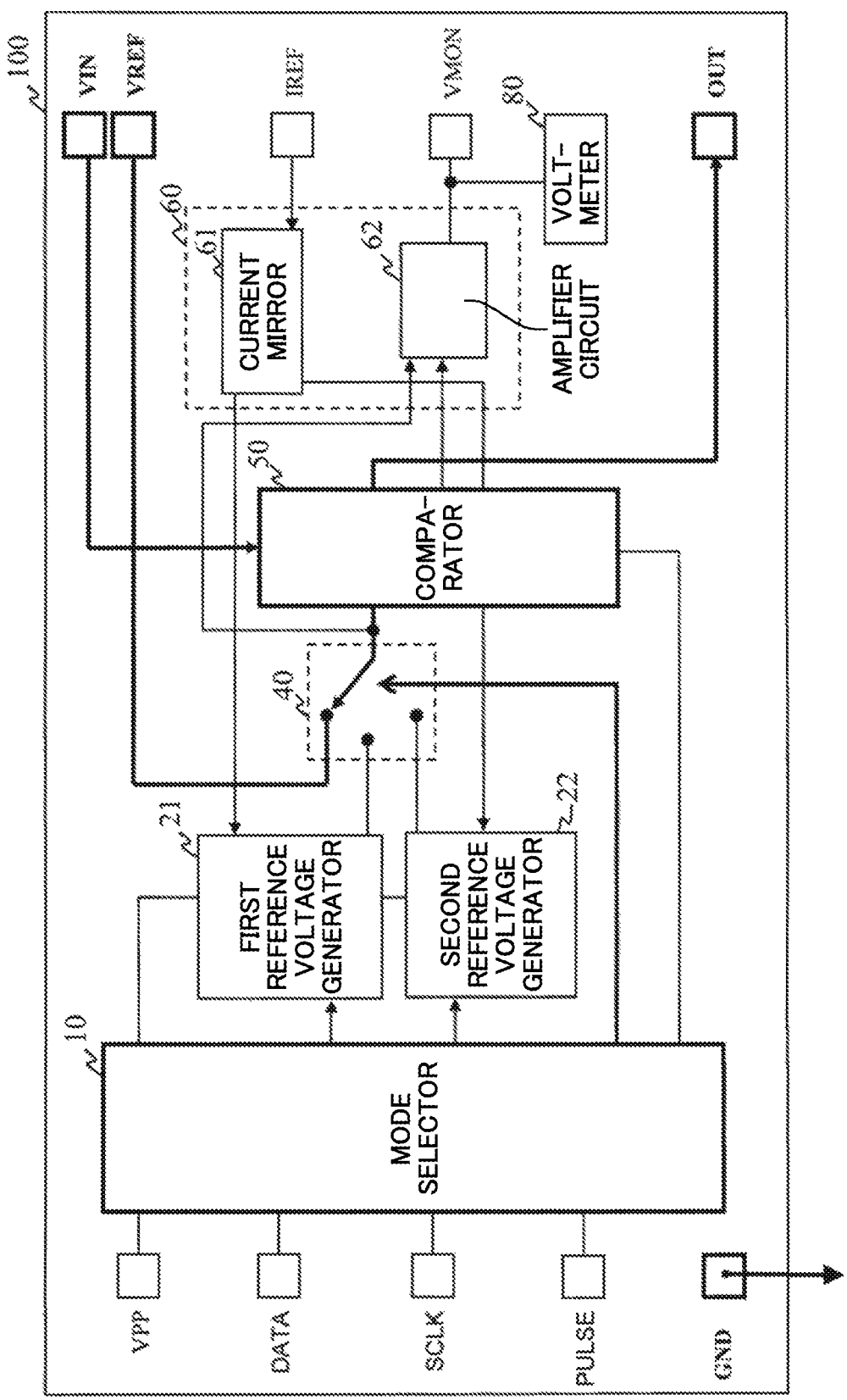
FIG. 4 shows in detail an exemplary structure of the voltage detector 100 relating to the embodiment of the present invention.

FIG. 4 shows in detail an exemplary structure of the voltage detector 100 relating to the embodiment of the present invention. The voltage detector 100 relating to the present exemplary embodiment operates in three modes including a reference voltage detection mode, a reference voltage setting mode and an actual operation mode. In the reference voltage detection mode, the voltage detector 100 detects the reference voltage Vref that enables the comparator 50 to operate for the set target voltage. In the reference voltage setting mode, the voltage detector 100 adjusts the settings of the reference voltage generator 20 to cause the reference voltage generator 20 to output the detected reference voltage Vref. In the actual operation mode, the voltage detector 100 uses the designated reference voltage Vref to compare the input voltage Vin against the target voltage. The voltage detector 100 relating to the present exemplary embodiment further includes a mode selector 10 and a test circuit 60 in addition to the constituents shown in FIG. 1. Furthermore, the voltage detector 100 has VPP, DATA, SCLK, PULSE, GND, VIN, VREF, IREF, VMON and OUT terminals that establish electrical connection between the inside and the outside the voltage detector 100. Here, the single terminal may serve as the Vref terminal and the IREF terminal.

The mode selector 10 is configured to select the mode in which the voltage detector 100 is to operate. The mode selector 10 may select the operation mode based on the voltage input from the VPP terminal. The mode selector 10 controls the voltage selector 40, the first reference voltage generator 21 and the second reference voltage generator 22 according to the selected operation mode.

In the actual operation mode, the mode selector 10 controls the voltage selector 40 to select the reference voltage based on the signal indicating the output from the comparator 50. In this way, the hysteresis operation shown in FIG. 2 is realized. The test circuit 60 includes a current mirror 61 and an amplifier circuit 62. The test circuit 60 does not operate when the voltage detector 100 is in the actual operation mode and operates when the voltage detector 100 is in the reference voltage setting mode. The voltage selector 40 relating to the present exemplary embodiment selects one of the reference voltage VrefH output from the first reference voltage generator 21, the reference voltage VrefL output from the second reference voltage generator 22 and the setting voltage input into the VREF terminal from outside, according to the operation mode of the voltage detector 100, and inputs the selected voltage into the comparator 50.

The following first describes how the voltage detector 100 operates in the reference voltage detection mode. In FIG. 4, the bold lines indicate the main signal flows during the reference voltage detection mode. When selecting the reference voltage detection mode, the mode selector 10 controls the voltage selector 40 to select the setting voltage Vref output from the VREF terminal. During the reference voltage detection mode, the setting voltage input into the VREF terminal gradually changes its level. The voltage selector 40 selects the gradually changing setting voltage Vref and inputs the selected setting voltage Vref into the input terminal of the CMOS inverter 51.

During the reference voltage detection mode, the target voltage for which the voltage detector 100 operates is input from the VIN terminal into the comparator 50. In the present exemplary embodiment, to hysteretically operate, the voltage detector 100 uses two target voltages, namely, the first target voltage V1 and the second target voltage V2. In this case, the first target voltage V1 and the second target voltage V2 are input into the VIN terminal in the stated order. The VIN terminal is connected to the power supply terminal of the comparator 50.

The comparator 50 operates according to the input setting voltage Vref and target voltages. As the setting voltage Vref gradually changes its level, the output from the comparator 50 transitions when the difference between the setting voltage Vref and the target voltage becomes no lower than a predetermined value. The output terminal of the comparator 50 is connected to the OUT terminal. The level of the setting voltage Vref observed when the output from the comparator 50 transitions is treated as the level of the reference voltage corresponding to the target voltage. The output from the comparator 50 may be monitored by an external device connected to the OUT terminal or an internal circuit in the voltage detector 100.

Figure 5:
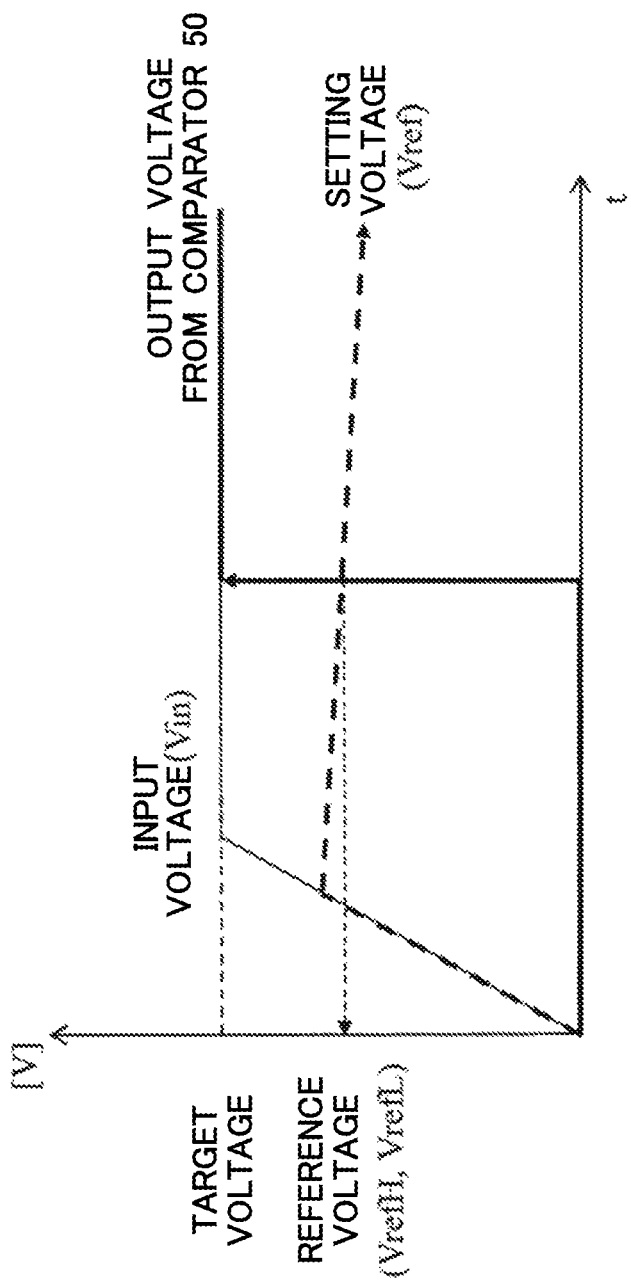
FIG. 5 schematically shows how to detect a reference voltage (VrefH, VrefL).

FIG. 5 schematically shows how to detect the reference voltages (VrefH, VrefL) in the reference voltage detection mode. The vertical axis represents the voltage levels [V] of the input voltage Vin input from the VIN terminal, the setting voltage Vref input into the input terminal of the CMOS inverter 51 and the reference voltage (VrefH, VrefL), and the horizontal axis represents the time t.

The target voltage input into the VIN terminal gradually increases as the time elapses and remains constant after reaching a predetermined level. The setting voltage Vref increases, as with the target voltage, until reaching an initial value that is higher by a predetermined value than a predicted reference voltage VrefH. After reaching the initial value, the setting voltage Vref gradually changes (in the present exemplary embodiment, drops) so that the level of the setting voltage Vref can be detected at which the output of the CMOS inverter 51 is inverted. The detected level of the setting voltage Vref is treated as the reference voltage for the input target voltage. The above-described steps are performed for both of the first target voltage V1 and the second target voltage V2 to detect the reference voltages VrefH and VrefL corresponding to the first target voltage V1 and the second target voltage V2. The mode selector 10 configures the reference voltage generator 20 based on the detected levels of the setting voltage. Here, the manners in which the input voltage and the setting voltage vary are not limited to the examples shown in FIG. 5. Alternatively, after the input voltage reaches the target voltage, the setting voltage may be varied to cause the output from the comparator 50 to transition.

Figure 6:
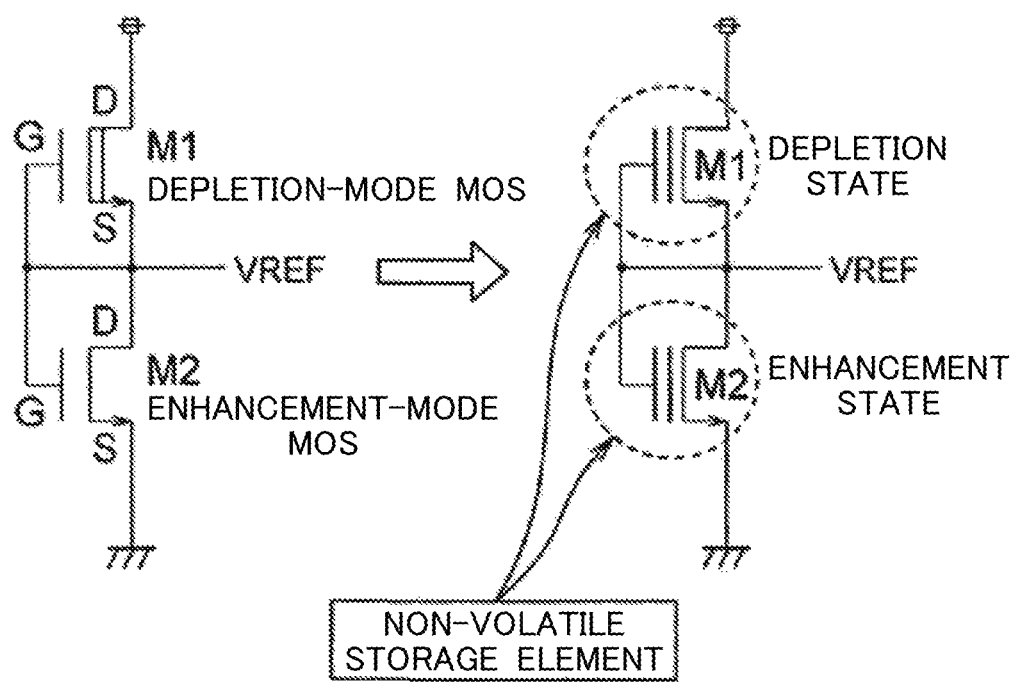
FIG. 6 shows a basic circuit for a reference voltage generator 20 relating to the embodiment of the present invention.

FIG. 6 shows a basic circuit for the reference voltage generator 20 relating to the embodiment of the present invention. The first reference voltage generator 21 and the second reference voltage generator 22 may each have the same circuit as the reference voltage generator 20. The reference voltage generator 20 relating to the embodiment of the present invention generates the reference voltage Vref using elements that can take two states of the enhancement state and the depletion state, as shown in the right view in FIG. 6.

In FIG. 6, the left view shows the reference voltage generator 20 constituted by a depletion-mode MOS transistor M1 and an enhancement-mode MOS transistor M2. The modes of operation of the respective MOS transistors shown in the left view in FIG. 6, in other words, whether they operate in the depletion mode or in the enhancement mode, is determined by the manufacturing parameters such as the doses.

In FIG. 6, the right view shows the reference voltage generator 20 including a first MOS transistor M1 controlled to operate in the depletion mode and a second MOS transistor M2 controlled to operate in the enhancement mode. The first MOS transistor M1 and the second MOS transistor M2 each include a floating gate and a control gate. In the present exemplary embodiment, the first MOS transistor M1 and the second MOS transistor M2 each function as a non-volatile storage element. Specifically speaking, the first MOS transistor M1 and the second MOS transistor M2 each store in the floating gate electric charges, the state of which is controlled by the voltage applied to the control gate so that the first MOS transistor M1 and the second MOS transistor M2 each exhibit the characteristics determined by the amount of the stored electric charges. The state of the electric charges stored in the floating gate indicates, for example, the polarity and amount of the electric charges stored in the floating gate. In the present exemplary embodiment, as the state of the electric charges stored in the floating gate varies, the threshold voltages of the first MOS transistor M1 and the second MOS transistor M2 vary. In this manner, the MOS transistors are each controlled to operate in the depletion or enhancement mode.

Referring to the first MOS transistor M1, the gate terminal and the source terminal are connected to each other and the drain terminal is connected to the power supply. The first MOS transistor M1 is controlled to operate in the depletion mode in response to injection of positive charges into its floating gate. Here, the depletion mode indicates that the transistor is turned off in response to application of 0 V into its gate terminal, or a normally-off element.

Referring to the second MOS transistor M2, the gate terminal and the drain terminal are connected to each other and the source terminal is grounded. The drain terminal of the second MOS transistor M2 is connected to the source terminal of the first MOS transistor M1. The second MOS transistor M2 is controlled to operate in the enhancement mode in response to injection of negative charges into its floating gate. Here, the enhancement mode indicates that the transistor is turned on in response to application of 0 V into its gate terminal, or a normally-on element. The reference voltage generator 20 outputs the reference voltage Vref from the connection point between the first MOS transistor M1 and the second MOS transistor M2.

The modes of operation of the non-volatile storage elements in the reference voltage generator 20 shown in the right view in FIG. 6 can be controlled after manufacturing. Thus, the reference voltage generator 20 shown in the right view in FIG. 6 can compensate for the discrepancy between the characteristics designated at the time of designing and the characteristics exhibited after manufacturing. For this reason, the reference voltage generator 20 can adjust the reference voltage Vref output from the connection point between the first MOS transistor M1 and the second MOS transistor M2. The mode selector 10 adjusts the reference voltage Vref by controlling the states of the electric charges stored in the floating gates of the first MOS transistor M1 and the second MOS transistor M2.

Figure 7:
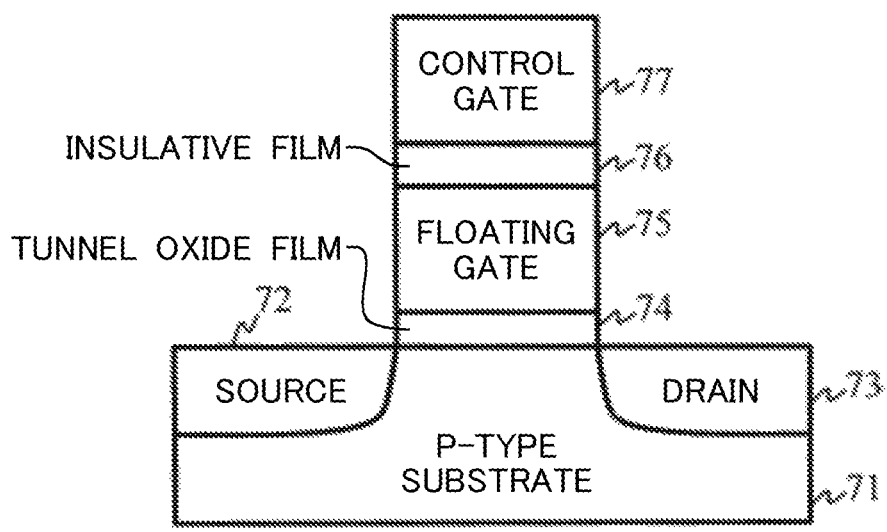
FIG. 7 shows a non-volatile storage element 70 including a tunnel oxide film.

FIG. 7 shows a non-volatile storage element 70 including a tunnel oxide film. The non-volatile storage element 70 includes a substrate 71, a tunnel oxide film 74, a floating gate 75, an insulative film 76 and a control gate 77.

The non-volatile storage element 70 is of the NMOS type and can be controlled to operate in the enhancement or depletion mode by having the floating gate 75. In the present exemplary embodiment, the substrate 71 is a p-type substrate. The substrate 71 has a source region 72 and a drain region 73. The source region 72 and the drain region 73 can be formed using common CMOS processes such as ion implantation. On the substrate 71, the tunnel oxide film 74, the floating gate 75, the insulative film 76 and the control gate 77 are stacked in the stated order.

The control gate 77 controls the channel region formed between the source region 72 and the drain region 73 in response to the voltage applied to the gate terminal of the non-volatile storage element 70. In this way, the non-volatile storage element 70 turns on and off the currents flowing between the source region 72 and the drain region 73.

The insulative film 76 is configured to insulate the floating gate 75 and the control gate 77 from each other. The insulative film 76 is formed by an insulative film generally used in CMOS processes. The state of the electric charges accumulated in the floating gate 75 changes in response to the voltage applied to the control gate 77. For example, the amount of electric charges accumulated in the floating gate 75 varies in the positive or negative direction depending on the voltage applied to the control gate 77. In this manner, the threshold voltage of the non-volatile storage element 70 varies so that the non-volatile storage element 70 can be controlled to operate in the depletion or enhancement mode.

The tunnel oxide film 74 normally insulates the substrate 71 and the floating gate 75 from each other. In response to application of a voltage equal to or higher than a predetermined value to the control gate 77, however, the tunnel oxide film 74 becomes electrically conductive due to the FN tunneling (the Fowler-Nordheim tunneling). The FN tunneling indicates movement of electrons tunneling through an insulator. The electrons are injected from the source region 72 into the floating gate 75 or emitted from the floating gate 75 due to the FN tunneling. This is how to control the state of the electric charges stored in the floating gate 75.

Figure 8:
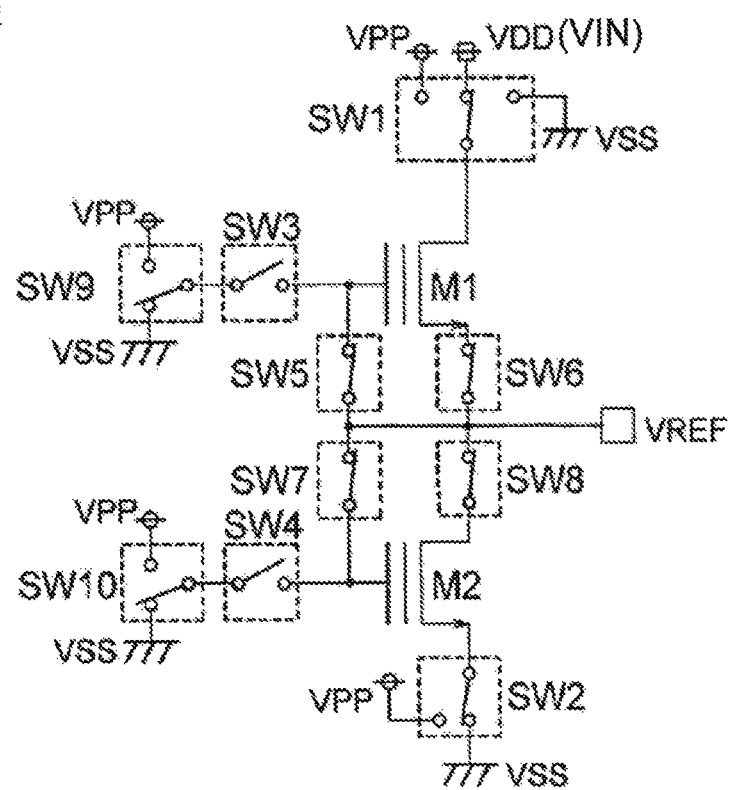
FIG. 8 shows an exemplary circuit structure of the reference voltage generator 20.

FIG. 8 shows an exemplary circuit structure of the reference voltage generator 20. While the reference voltage generator 20 is outputting the reference voltage Vref, the switches (SW) are controlled as follows.

SW1: VDD
SW2: VSS
SW3, SW4: OPEN

SW5, SW6, SW7, SW8: SHORT (CONNECTED)
SW9, SW10: AS DESIRED

While the switches are controlled as shown in FIG. 8, the reference voltage generator 20 generates the reference voltage Vref with the first MOS transistor M1 being in the depletion state and the second MOS transistor M2 being in the enhancement state.

The switches SW1 to 10 need to operate at high voltages and thus have a high on resistance than normal switches. In particular, the switches SW1, SW6, SW8 and SW2 are included in the current path of the reference voltage generator 20, and the on resistances of these switches affect the reference voltage Vref.

To be more specific, the reference voltage generator 20 includes the first MOS transistor M1 that includes a control gate and a floating gate and that is controlled to operate in the depletion mode. The reference voltage generator 20 additionally includes the second write MOS transistor M2 that includes a control gate and a floating gate and that is controlled to operate in the enhancement mode. The second write MOS transistor M2 is connected in series with the first MOS transistor M1. The first MOS transistor M1 and the second write MOS transistor M2 are non-volatile storage elements that each include a tunnel oxide film that allows the electric charges to tunnel therethrough to be injected into the floating gate. The reference voltage generator 20 outputs a reference voltage from the connection point between the first MOS transistor M1 and the second write MOS transistor M2.

Figure 9:
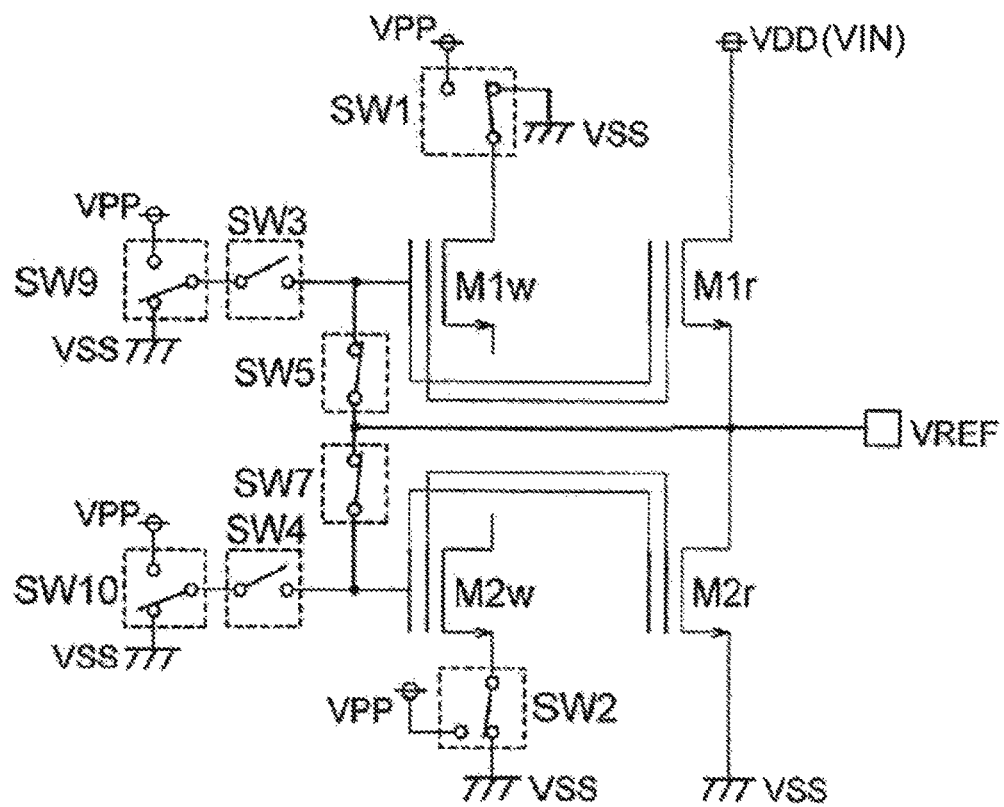
FIG. 9 shows an exemplary circuit structure of the reference voltage generator 20 relating to the embodiment of the present invention.

FIG. 9 shows an exemplary circuit structure of the reference voltage generator 20 relating to the present embodiment. The first reference voltage generator 21 and the second reference voltage generator 22 may include the same circuit as the circuit of the reference voltage generator 20 shown in FIG. 9. The reference voltage generator 20 includes a first write MOS transistor M1w having a tunnel oxide film and a first output MOS transistor M1r having no tunnel oxide film, and a second write MOS transistor M2w having a tunnel oxide film and a second output MOS transistor M2r having no tunnel oxide film.

The first write MOS transistor M1w and the first output MOS transistor M1r each include a floating gate and a control gate. The floating gate and the control gate of the first write MOS transistor M1w are respectively electrically connected to the floating gate and the control gate of the first output MOS transistor M1r.

The source terminal of the first write MOS transistor M1w is connected to the drain terminal of the second write MOS transistor M2w. As is with the structure shown in FIG. 8, there may be further a switch to switch whether to connect or not the first write MOS transistor M1w and the second write MOS transistor M2w. The switch SW1 selects which one of the voltage VPP and the voltage VSS such as the ground potential is to be applied to the drain terminal of the first write MOS transistor M1w. The switch SW2 selects which one of the voltage VPP and the voltage VSS such as the ground potential is to be applied to the source terminal of the second write MOS transistor M2w.

A predetermined voltage VDD is applied to the drain terminal of the first output MOS transistor M1r. The source terminal of the first output MOS transistor M1r is connected to the drain terminal of the second output MOS transistor M2r. The voltage at this connection point is output as the reference voltage Vref. The voltage VSS is applied to the source terminal of the second output MOS transistor M2r.

The second write MOS transistor M2w and the second output MOS transistor M2r each include a floating gate and a control gate. The floating gate and the control gate of the second write MOS transistor M2w are respectively electrically connected to the floating gate and the control gate of the second output MOS transistor M2r.

The first write MOS transistor M1w and the second write MOS transistor M2w each include a tunnel oxide film. Through the tunnel oxide film, the state of the electric charges in the floating gate of each of the first write MOS transistor M1w and the second write MOS transistor M2w is controlled. In this manner, the threshold voltages Vth of the first write MOS transistor M1w and the second write MOS transistor M2w can be controlled. Since the floating gate and the control gate of the first MOS transistor M1w are electrically connected to the floating gate and the control gate of the first MOS transistor M1r as described above, the first output MOS transistor M1r has the same threshold voltage Vth as the first write MOS transistor M1w. In the same manner, the second output MOS transistor M2r has the same threshold voltage Vth as the second write MOS transistor M2w.

Since the first output MOS transistor M1r and the second output MOS transistor M2r have no tunnel oxide film, their threshold voltages Vth are not changed by disturb. Accordingly, the reference voltage Vref can be accurately generated. The first output MOS transistor M1r and the second output MOS transistor M2r form a current path in the reference voltage generator 20 but no switches are included in the current path. This means that the reference voltage Vref can avoid being influenced by the on resistances of such switches and be accurately generated.

Figure 10:
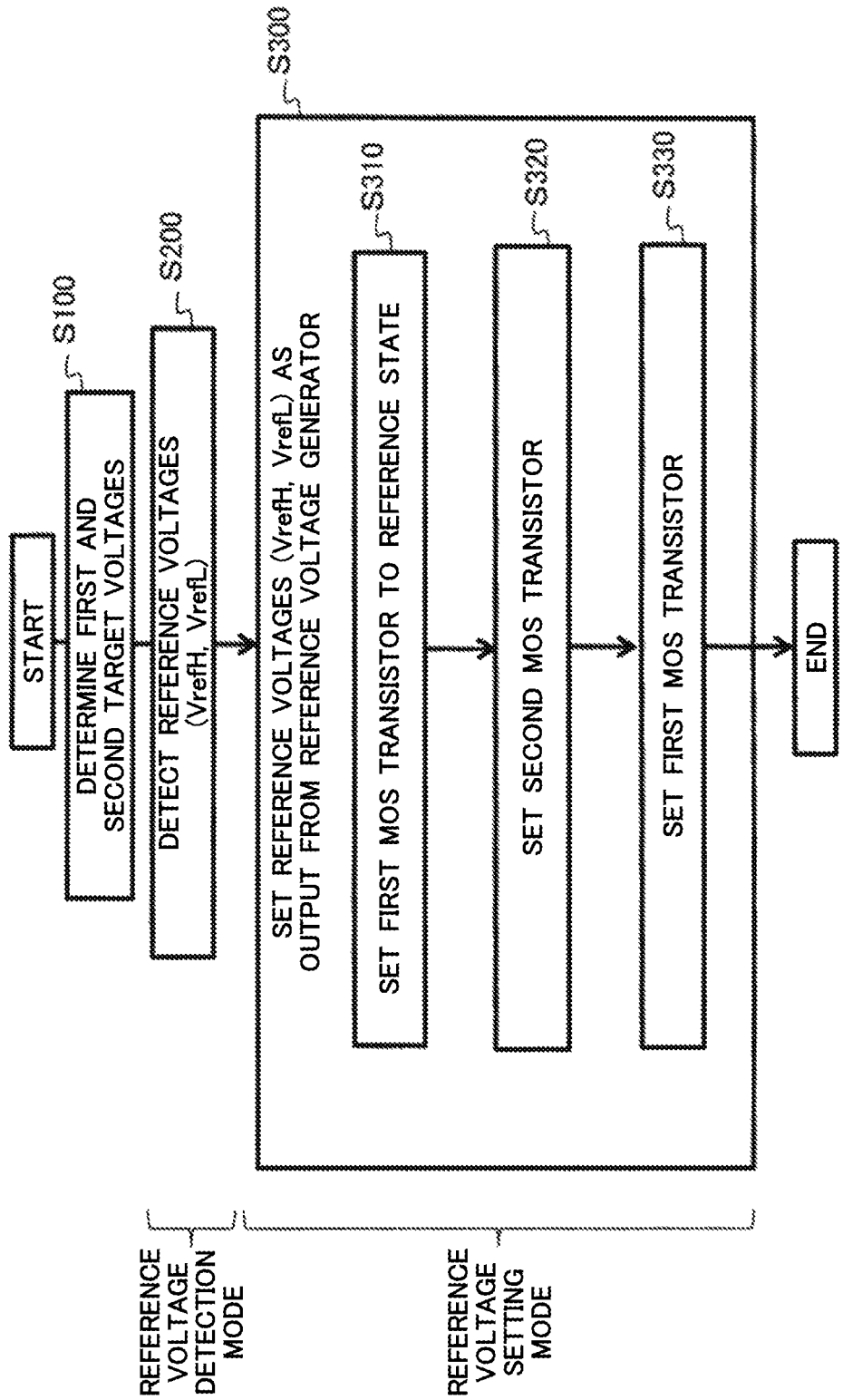
FIG. 10 is a flow chart showing how to set the reference voltage.

FIG. 10 is a flow chart showing, as an example, how to set the reference voltage. In a step S100, the target voltage, which is to be input into the power supply terminal of the CMOS inverter 51, is set at a predetermined value.

During the reference voltage detection mode, a voltage is detected which is to be input into the input terminal of the CMOS inverter 51 in order to allow the comparator 50 to operate according to the target voltage. In a step S200, the reference voltage (VrefH, VrefL) corresponding to the target voltage set in the step S100 is detected in the manner described with reference to FIG. 5. The detected reference voltage (VrefH, VrefL) is stored on a device external to the voltage detector 100. The detected reference voltage (VrefH, VrefL) may be stored within the voltage detector 100.

During the reference voltage setting mode, the reference voltage (VrefH, VrefL) detected in the step S200 is set in the reference voltage generator 20. A step S300 of performing the reference voltage setting mode includes steps S310 to S330. Note that the step S300 is performed for each target voltage. The set target voltage is input into the power supply terminal of the CMOS inverter 51.

In the step S310, the state of the electric charges stored in the floating gate of the first write MOS transistor M1w is set to a predetermined reference state. The reference state employed in the step S310 may indicate such a state in which the first MOS transistors M1w and M1r have a sufficiently high threshold voltage to prevent currents from flowing from the first MOS transistors M1w and M1r into the second MOS transistors M2w and M2r. The reference state may indicate such a state that the stored electric charges have been deleted from the floating gate (in other words, the floating gate has substantially zero electric charges). In the step S310, the state of the electric charges in the floating gate of the first write MOS transistor M1w is adjusted to be the reference state by applying a control pulse to the control gate. As a result, currents are prevented from flowing from the first MOS transistors M1w and M1r to the second MOS transistor M2w and M2r.

In the step S320, while an adjust current, which is generated by the current mirror 61, is being applied to the second output MOS transistor M2r, a control pulse is applied to the control gate of the second write MOS transistor M2w. The application of the control pulse changes the threshold voltage of the second write MOS transistor M2w in the positive direction. In this manner, the two second MOS transistors M2 are brought into a predetermined enhancement state. The adjust current may be substantially equal to the current that is expected to flow through the second output MOS transistor M2r when the voltage detector 100 actually operates. In the step S320, the control pulse is kept applied to the control gate of the second write MOS transistor M2w until the reference voltage Vref output from the reference voltage generator 20 becomes substantially equal to the reference voltage Vref that has been detected in the step S200 correspondingly to the target voltage.

Subsequently in the step S330, while the adjust current, which is generated by the current mirror 61, is prevented from being applied to the second output MOS transistor M2r, a control pulse is applied to the control gate of the first write MOS transistor M1w. The application of the control pulse changes the threshold voltage of the first write MOS transistor M1w in the negative direction. In this manner, the two first MOS transistors M1 are brought into a predetermined depletion state. In the step S330, the control pulse is also kept applied to the control gate of the first write MOS transistor M1w until the reference voltage Vref output from the reference voltage generator 20 becomes substantially equal to the reference voltage Vref that has been detected in the step S200 correspondingly to the target voltage. The above-described steps are performed for the first reference voltage generator 21 and the second reference voltage generator 22. As a result, the first reference voltage generator 21 and the second reference voltage generator 22 can be configured to output the voltages equal to the reference voltages detected in the step S200. Referring to the step S300, the reference voltage VrefH may be set prior or subsequent to the reference voltage VrefL.

Figure 11A:
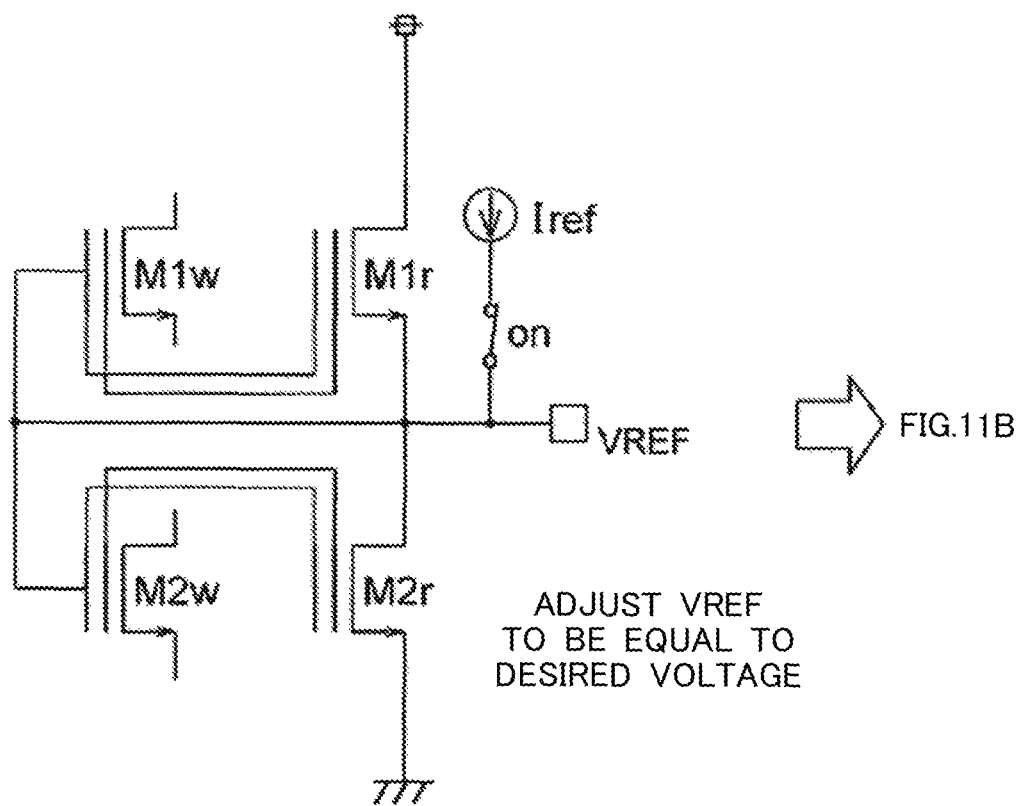
FIGS. 11A and 11B illustrate how to set the reference voltage Vref.
Figure 11B:
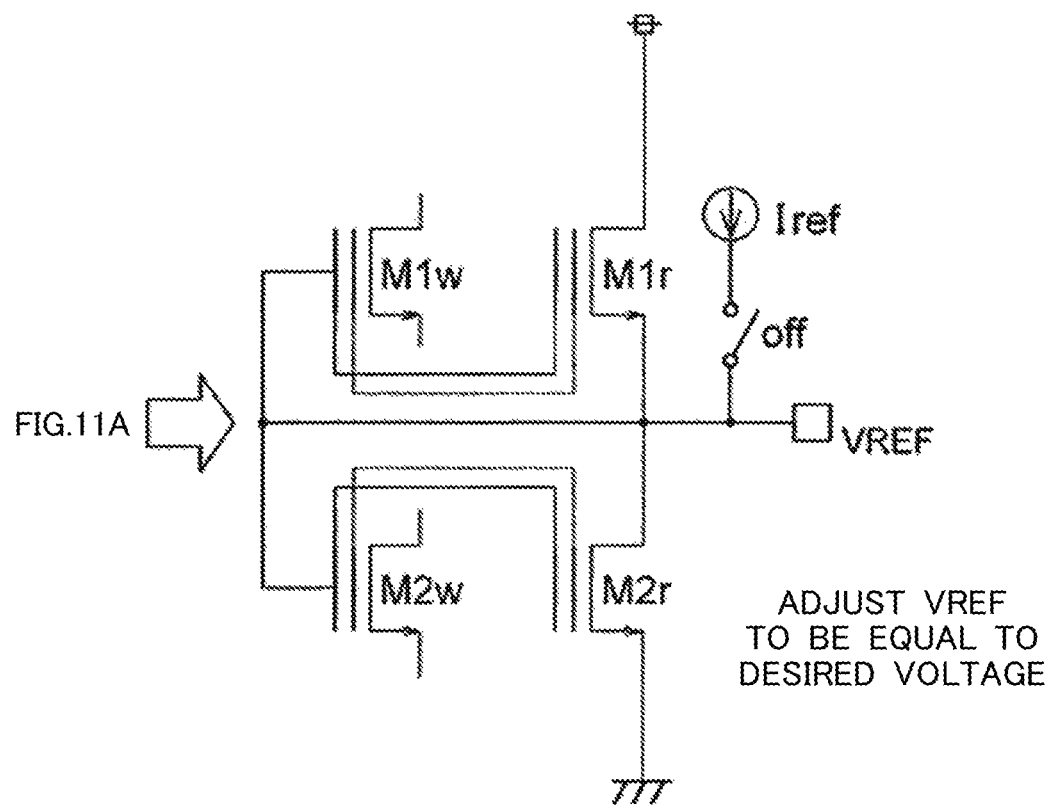

FIGS. 11A and 11B illustrate how to set the reference voltage Vref FIG. 11A illustrates how to set the second MOS transistors M2w and M2r, which are controlled to operate in the enhancement mode. To start with, the state of the electric charges charged in the floating gate of the first write MOS transistor M1w is set to the reference state. For example, the state of the electric charges is set to the reference state by applying to the control gate a control pulse that is configured to sufficiently raise the threshold voltage of the first write MOS transistor M1w. The polarity of the voltage applied to the control gate can be controlled by switching the switches SW1 and SW9. In this way, currents are prevented from flowing through the first MOS transistor M1w and M1r while steps are performed to set the second MOS transistors M2w and M2r, which are controlled to operate in the enhancement mode.

After this, while the adjust current Iref is being applied to the second output MOS transistor M2r, the control pulse is applied to the control gate of the second write MOS transistor M2w to charge the floating gate with electric charges. Here, the floating gate of the second write MOS transistor M2w is charged with electric charges in such a manner that the reference voltage Vref output from the reference voltage generator 20 reaches a predetermined voltage.

FIG. 11B shows how to set the first MOS transistors M1w and M1r, which are controlled to operate in the depletion mode. The adjust current Iref is stopped to set the first MOS transistors M1w and M1r. The control pulse is applied to the control gate of the second write MOS transistor M2w to charge the floating gate with electric charges, in such a manner that the currents flowing through the second output MOS transistor M2r becomes substantially the same as the adjust current Iref. In the present exemplary embodiment, instead of detecting the currents flowing through the second output MOS transistor M2r, the floating gate of the second write MOS transistor M2w is charged with electric charges so that the reference voltage Vref output from the reference voltage generator 20 reaches the above-described predetermined voltage.

Figure 12A:
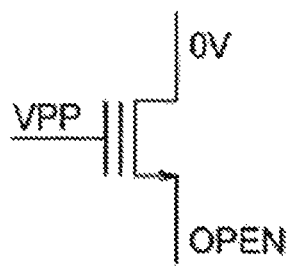
FIGS. 12A and 12B show how to set the non-volatile storage element 70 relating to the embodiment of the present invention.
Figure 12B:
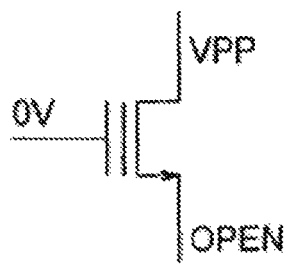

FIGS. 12A and 12B show how to set the non-volatile storage element 70. The non-volatile storage element 70 corresponds to the above-described first write MOS transistor M1w and second write MOS transistor M2w. The non-volatile storage element 70 is an NMOS element including a control gate and a floating gate. The non-volatile storage element 70 makes use of the FN tunneling to accumulate electric charges in the floating gate, which is used to adjust the threshold voltage.

FIG. 12A shows a bias condition to change the threshold voltage of the non-volatile storage element 70 in the positive direction. FIG. 12B shows a bias condition to change the threshold voltage of the non-volatile storage element 70 in the negative direction. By applying the control pulse to the control gate under these bias conditions, the threshold voltage of the non-volatile storage element 70 is controlled.

To change the threshold voltage in the positive direction, the voltage VPP is applied to the control gate terminal, the source terminal is grounded, and the drain terminal is kept floating, as shown in FIG. 12A. As a result, electrons are injected into the floating gate of the non-volatile storage element 70 due to the FN tunneling, which increases the threshold voltage Vth of the non-volatile storage element 70. Here, the voltage VPP is equal to a voltage necessary to cause the FN tunneling through the tunnel oxide film of the non-volatile storage element 70.

To change the threshold voltage in the negative direction, the control gate terminal is grounded, the voltage VPP is applied to the source terminal, and the drain terminal is kept floating, as shown in FIG. 12B. As a result, electrons are released from the floating gate of the non-volatile storage element 70 due to the FN tunneling, which decreases the threshold voltage Vth of the non-volatile storage element 70. The combinations of the steps illustrated in FIGS. 12A and 12B can be used to adjust the threshold voltage of the non-volatile storage element 70 to become equal to a predetermined voltage. As described above, by adjusting the threshold voltages of the first write MOS transistor M1w and the second write MOS transistor M2w, the threshold voltages of the first output MOS transistor M1r and the second output MOS transistor M2r are adjusted.

Figure 13:
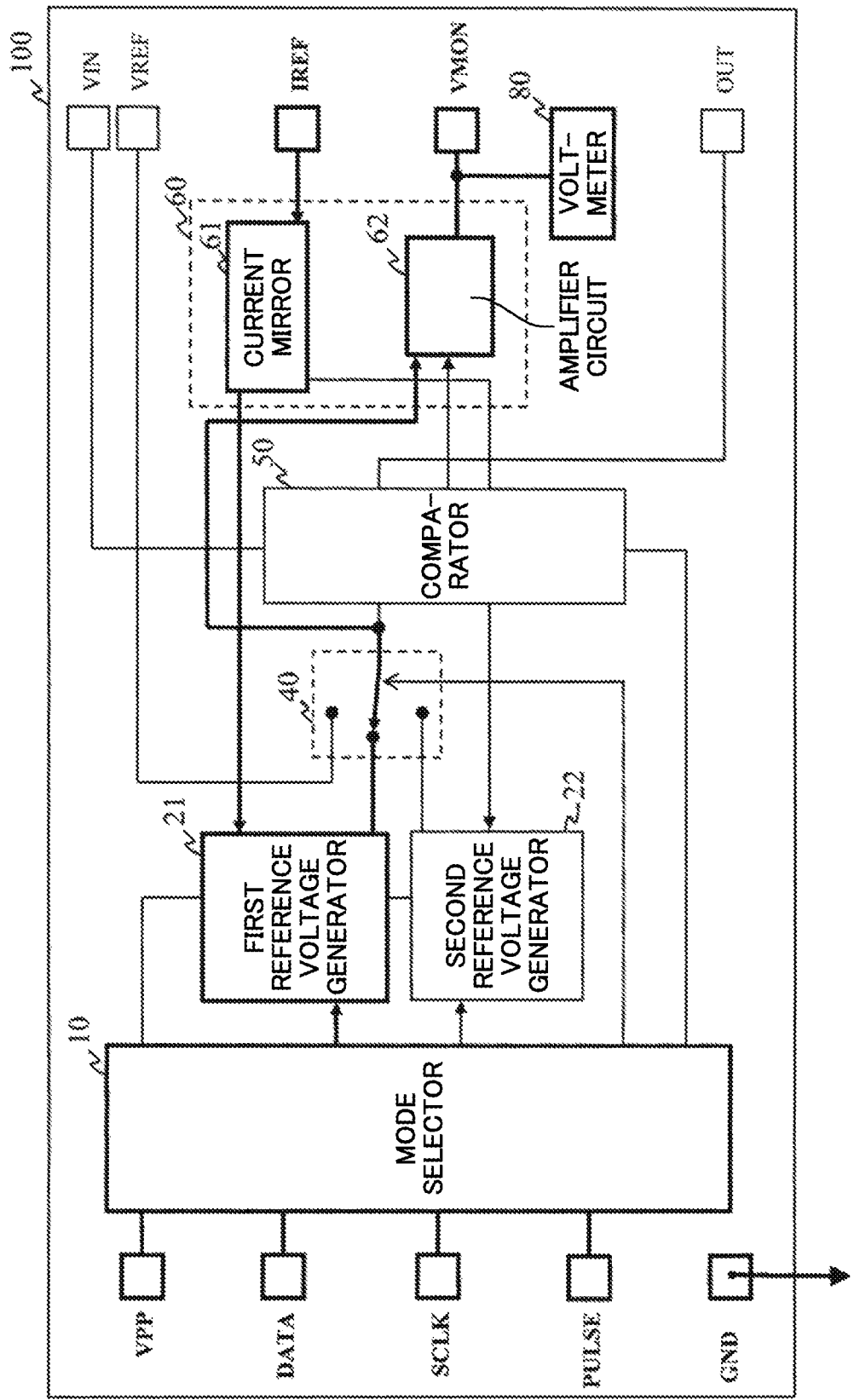
FIG. 13 shows, as an example, how the voltage detector 100 operates in a reference voltage setting mode.

FIG. 13 shows, as an example, how the voltage detector 100 operates in the reference voltage setting mode. In the present example, the voltage detector 100 is in such a state that a write operation is performed into the second write MOS transistor M2w of the first reference voltage generator 21. The main components used in the present example are indicated by the bold lines.

The mode selector 10 applies the control pulse to the second write MOS transistor M2w of the first reference voltage generator 21. The mode selector 10 controls the voltage selector 40 to select the Vref terminal. In this case, no voltage is input from outside into the Vref terminal. The current mirror 61 generates the adjust current Iref based on an external current IREF and outputs the generated adjust current Iref to the first reference voltage generator 21. Here, the adjust current Iref is smaller than the external current IREF. For example, the current mirror 61 generates the adjust current Iref that is 1/n times as large as the external current IREF (here, n>1). In this way, a minute adjust current Iref can be accurately generated. When the voltage detector 100 does not include the current mirror 61, a minute adjust current Iref may be input from outside the voltage detector 100.

The amplifier circuit 62 receives the output from the first reference voltage generator 21 through the voltage selector 40, amplifies the output to generate an amplified signal and outputs the amplified signal to the VMON terminal. The voltmeter 80 receives the amplified signal output from the amplifier circuit 62. This improves the signal to noise ratio of the measurement device that is connected to the VMON terminal. The voltmeter 80 detects the voltage of the amplified signal output from the amplifier circuit 62. The voltmeter 80 may be provided outside the voltage detector 100. The mode selector 10 applies the control pulse to the second write MOS transistor M2w of the first reference voltage generator 21 in such a manner that the voltage output from the amplifier circuit 62 reaches the voltage corresponding to the reference voltage to be set.

Adjust sequences (1) to (5), described later, are used to set the reference voltage VefH in the first reference voltage generator 21 relating to the present exemplary embodiment. The reference voltage VrefL is set in the second reference voltage generator 22 in the same manner as is the case where the reference voltage VrefH is set in the first reference voltage generator 21 of the present exemplary embodiment.

Figure 14:
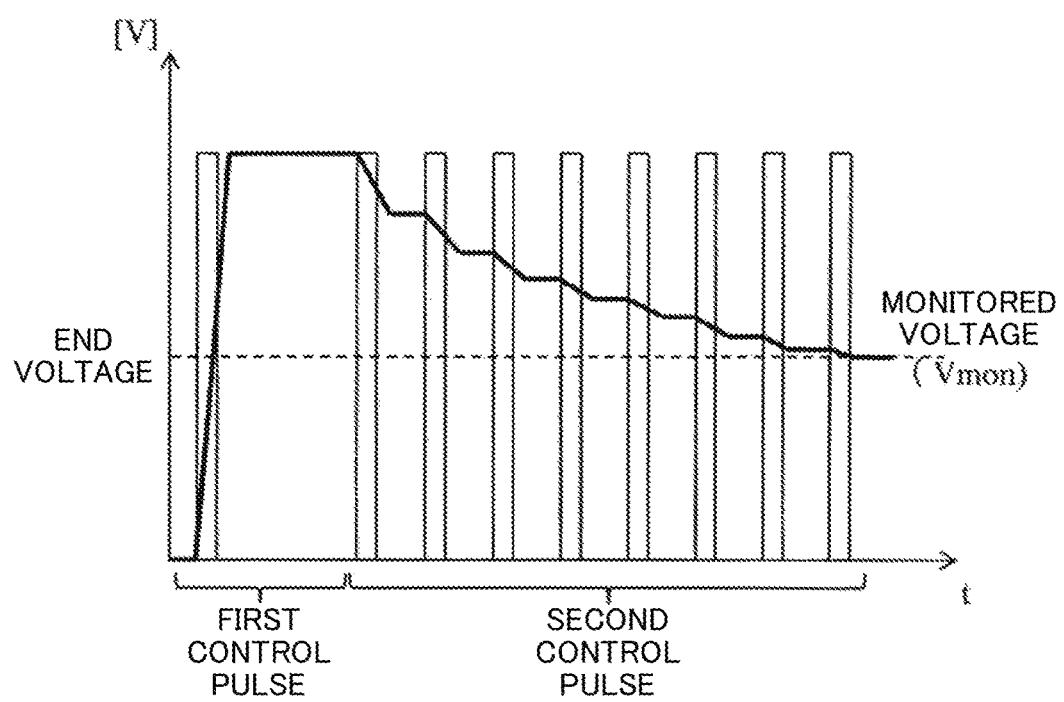
FIG. 14 shows a write operation into an enhancement-mode MOS transistor M2.

FIG. 14 shows a write operation into the second write MOS transistor M2w. The vertical axis represents the monitored voltage [V] and the horizontal axis represents the time t. The mode selector 10 inputs a control pulse into the second write MOS transistor M2w.

To begin with, a first control pulse is applied to the control gate of the second write MOS transistor M2w to set the state of the electric charges accumulated in the floating gate of the second write MOS transistor M2w to a predetermined initial state. This raises the monitored voltage Vmon, which indicates the voltage output from the reference voltage generator 20. The control pulse is kept applied to the control gate of the second write MOS transistor M2w until the monitored voltage Vmon of the reference voltage generator 20 becomes sufficiently higher than an end voltage, which denotes the voltage to be set in the reference voltage generator 20.

Subsequently, a second control pulse is applied to the control gate of the second write MOS transistor M2w to control the state of the electric charges in the floating gate of the second write MOS transistor M2w. The second control pulse has an opposite polarity to the first control pulse. In the present exemplary embodiment, the application of the second control pulse lowers the monitored voltage Vmon of the reference voltage generator 20. The second control pulse is applied in such a manner that the monitored voltage Vmon of the reference voltage generator 20 gradually approaches the end voltage.

When the control pulse has a wide pulse width or has a high pulse voltage, the electric charges stored in the floating gate changes significantly in response to application of each control pulse. When the electric charges change significantly, the monitored voltage tends to significantly go beyond the end voltage. To address this issue, as the monitored voltage Vmon approaches the end voltage, the mode selector 10 adjusts at least one of the pulse width and the voltage of the second control pulse to reduce the intensity of the second control pulse. When the monitored voltage Vmon falls below the end voltage as a result of the application of the second control pulse, the mode selector 10 may input the first control pulse into the control gate. In this way, the monitored voltage Vmon is brought close to the end voltage. The described steps are continuously performed until the difference between the monitored voltage Vmon and the end voltage falls within an allowable range.

The mode selector 10 is connected to the VPP terminal, the DATA terminal, the SCLK terminal and the PULSE terminal. The mode selector 10 controls the voltage of the control pulse based on the voltage input from the VPP terminal. The mode selector 10 controls the pulse width of the control pulse based on the cyclic signal input from the PULSE terminal. The SCLK terminal outputs to the mode selector 10 a clock signal, which serves as an operational clock for the mode selector 10. The DATA terminal outputs to the mode selector 10 a data signal relating to a test mode.

Figure 15:
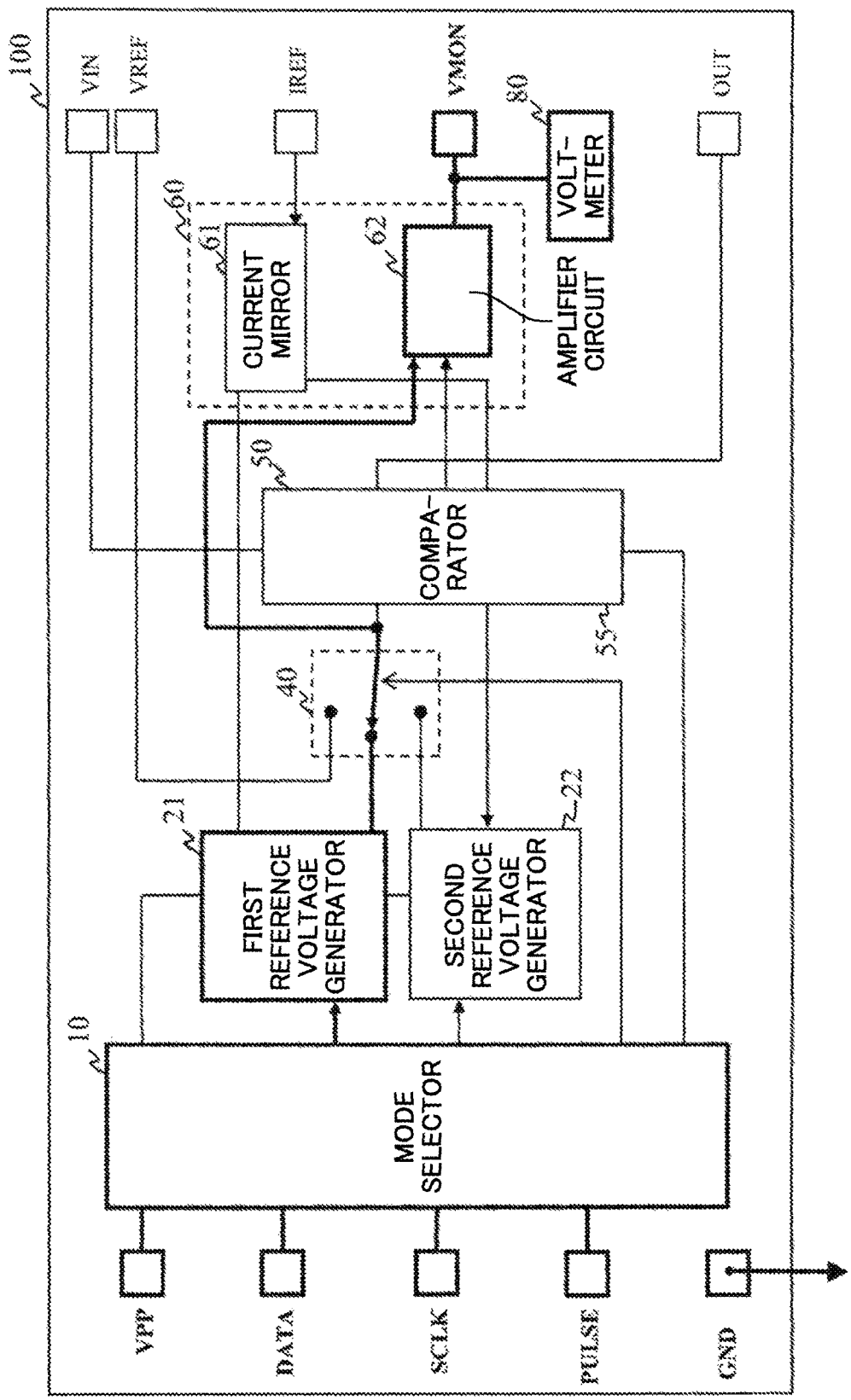
FIG. 15 shows, as an example, how the voltage detector 100 operates in a reference voltage setting mode.

FIG. 15 shows, as an example, how the voltage detector 100 operates in the reference voltage setting mode. In the present exemplary embodiment, the voltage detector 100 performs a write operation into the first write MOS transistor M1w of the first reference voltage generator 21. The components used in the present exemplary embodiment are indicated by the bold lines.

The write operation into the first write MOS transistor M1w is different from the write operation into the second write MOS transistor M2w shown in FIG. 13 in that the output from the current mirror 61 is not input into the first reference voltage generator 21. Except for this, the write operation is performed basically in the same manner as described with reference to FIG. 13.

Figure 16:
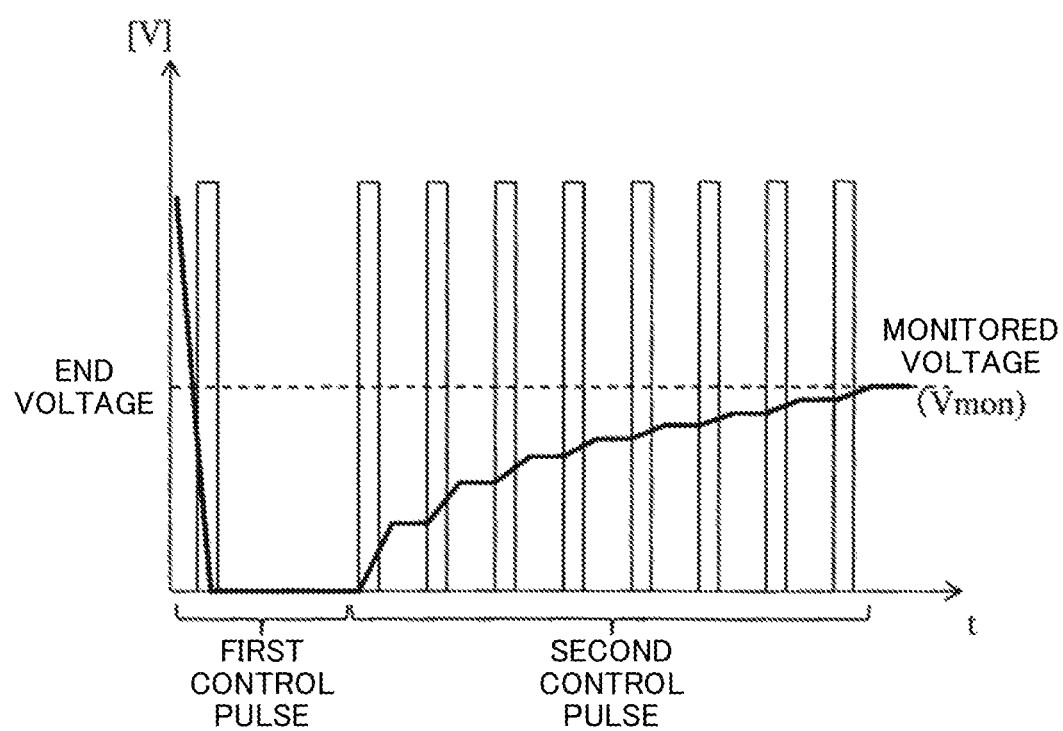
FIG. 16 shows a write operation into a depletion-mode MOS transistor M1$w$.

FIG. 16 shows a write operation into the first write MOS transistor M1w. The vertical axis represents the monitored voltage [V] and the horizontal axis represents the time t. The first write MOS transistor M1w receives a control pulse from the mode selector 10.

To begin with, a first control pulse is applied to the control gate of the first write MOS transistor M1w to set the state of the electric charges accumulated in the floating gate of the first write MOS transistor M1w in a predetermined initial state. This resultantly lowers the monitored voltage Vmon of the reference voltage generator 20. The first control pulse is kept applied to the control gate of the first write MOS transistor M1w until the monitored voltage Vmon of the reference voltage generator 20 falls sufficiently below an end voltage.

After this, a second control pulse is applied to the control gate of the first write MOS transistor M1w to control the state of the electric charges accumulated in the floating gate of the first write MOS transistor M1w. The second control pulse has an opposite polarity to the first control pulse. In the present exemplary embodiment, the application of the second control pulse raises the monitored voltage Vmon of the reference voltage generator 20. The second control pulse is adjusted in such a manner that the monitored voltage Vmon of the reference voltage generator 20 gradually approaches the end voltage.

Also in the case of the write operation into the first write MOS transistor M1w, the mode selector 10 adjusts at least one of the pulse width and the voltage of the second control pulse to reduce the intensity of the second control pulse as the monitored voltage Vmon approaches the end voltage.

The voltage detector 100 exits the reference voltage setting mode when the monitored voltage Vmon becomes substantially equal to the end voltage. The expression "the monitored voltage Vmon becomes substantially equal to the end voltage" means that the monitored voltage Vmon does not necessarily become perfectly equal to the end voltage and is only required to become substantially equal to the end voltage under certain usage conditions.

Figure 17:
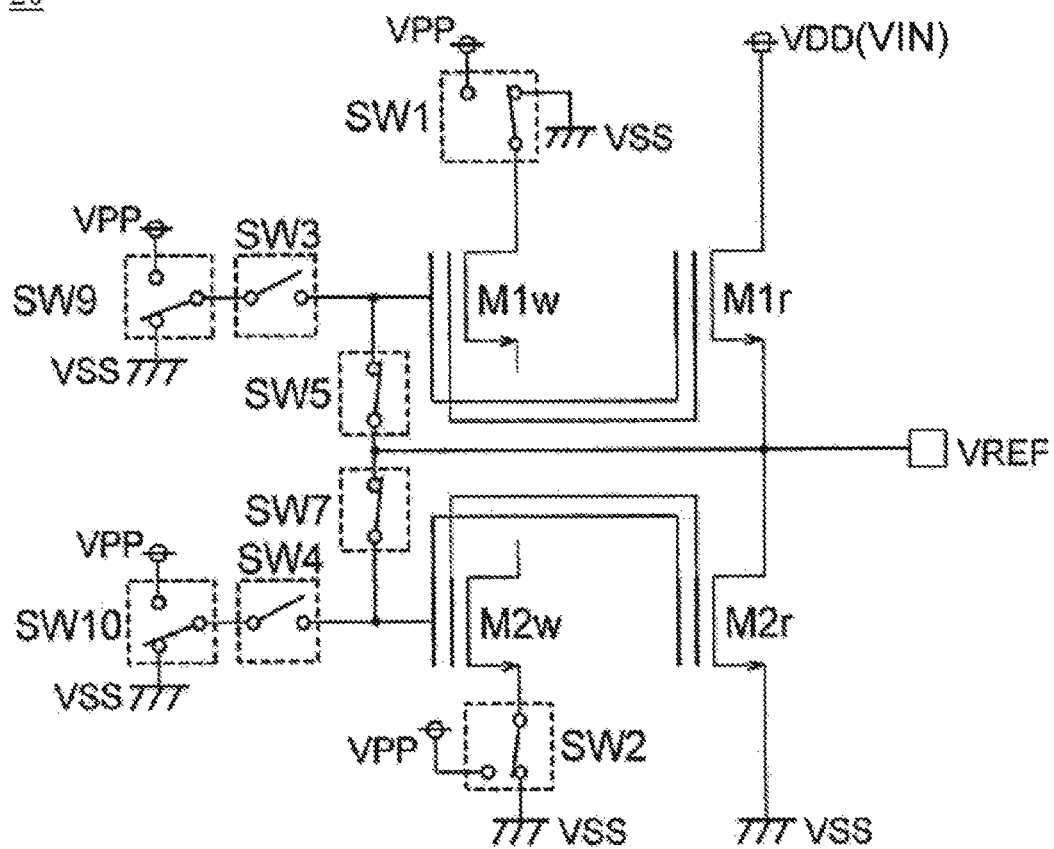
FIG. 17 shows an exemplary circuit structure of the reference voltage generator 20 relating to the embodiment of the present invention.

FIG. 17 shows an exemplary circuit structure of the reference voltage generator 20 relating to the embodiment of the present invention. The respective components are the same as the components of the circuit structure of the reference voltage generator 20 shown in FIG. 9. While the reference voltage generator 20 outputs the reference voltage Vref in the actual operation mode, the switches are controlled as follows as shown in FIG. 17.

SW1: VSS
SW2: VSS
SW3, SW4: OPEN
SW5, SW7: SHORT (connected)
SW9, SW10: AS DESIRED With the switches being controlled as in the present example, the reference voltage generator 20 uses the first MOS transistors M1w and M1r, which are set in the depletion state, and the second MOS transistors M2w and M2r, which are set in the enhancement mode, to generate the reference voltage Vref.

The reference voltage Vref output from the reference voltage generator 20 is adjusted using the adjust sequences (1) to (5).

<Adjust Sequence (1)>

Figure 18:
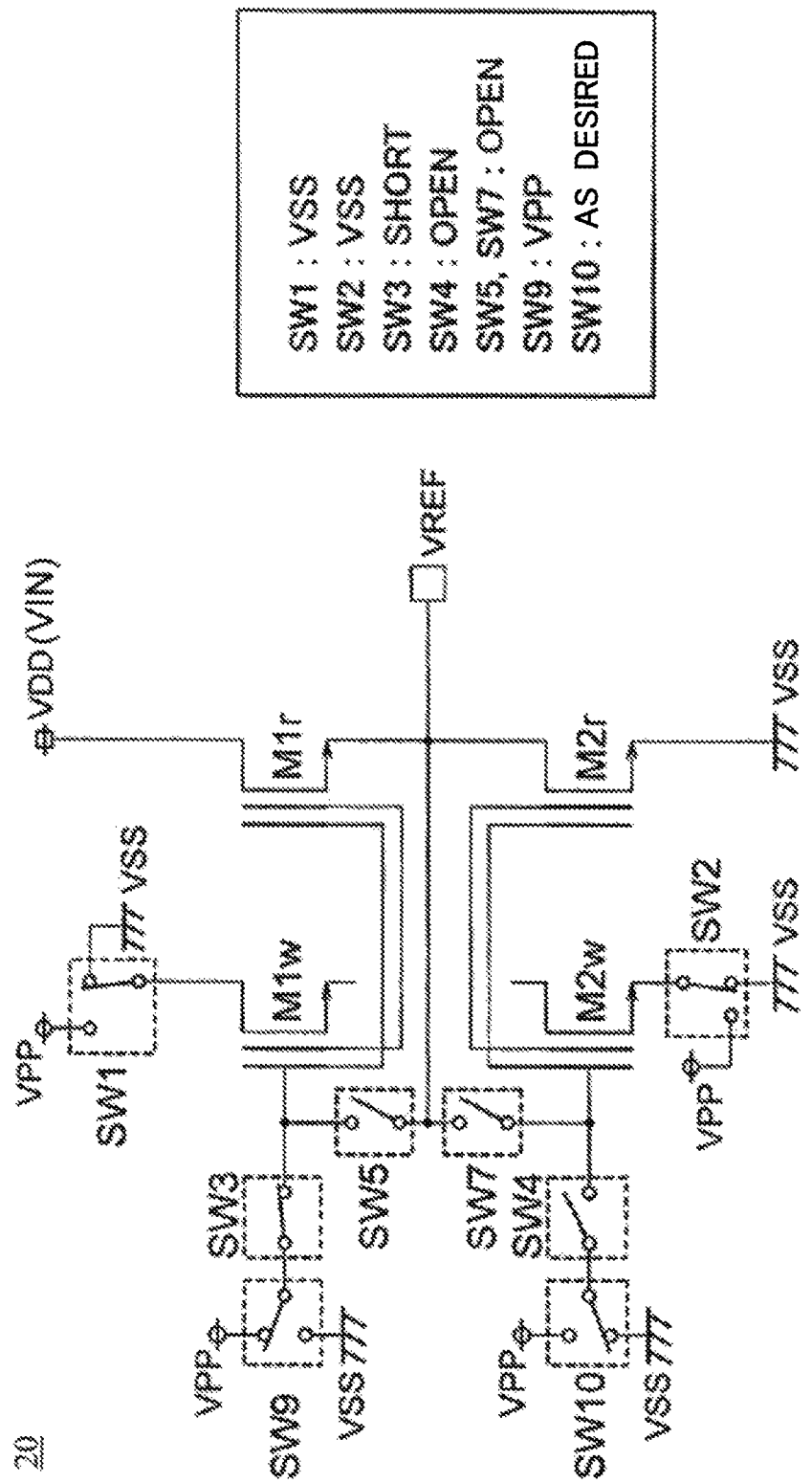
FIG. 18 shows an exemplary circuit structure of the reference voltage generator 20.

FIG. 18 shows an exemplary circuit structure of the reference voltage generator 20. The mode selector 10 applies a control pulse to the control gate of the first MOS transistor M1w in order to set the electric charges stored in the floating gates of the first MOS transistors M1w and M1r in the reference state. In the present exemplary embodiment, the threshold voltages of the first MOS transistors M1w and M1r are controlled to be sufficiently higher than the reference voltage Vref that should be set in the reference voltage generator 20. During the adjust sequence (1), the switches are controlled as follows. In this way, currents are prevented from flowing from the first MOS transistor M1 to the second MOS transistor M2.

SW1: VSS
SW2: VSS
SW3: SHORT
SW4: OPEN
SW5, SW7: OPEN
SW9: VPP
SW10: AS DESIRED

<Adjust Sequence (2)>

Figure 19:
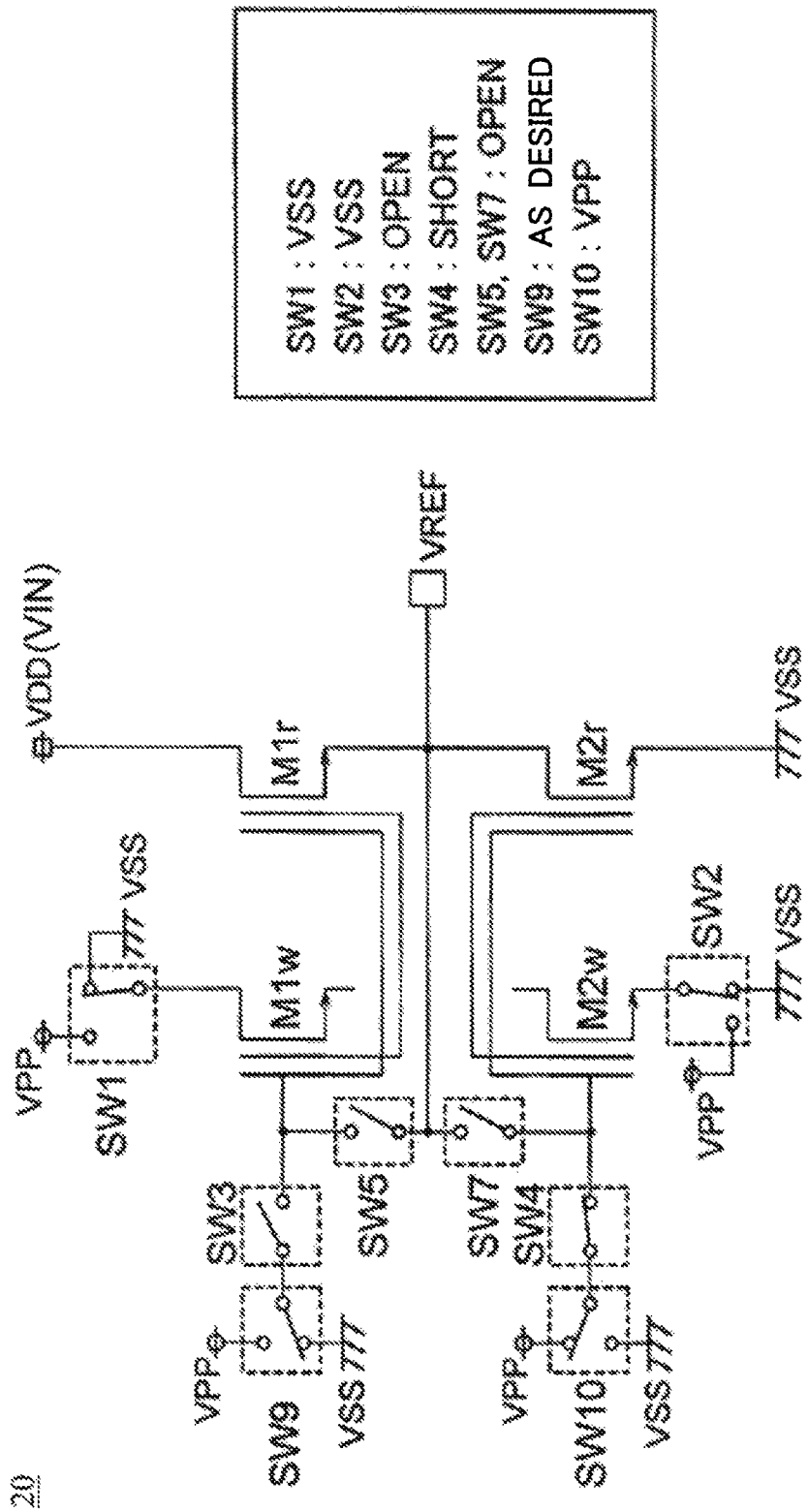
FIG. 19 shows an exemplary circuit structure of the reference voltage generator 20.

FIG. 19 shows an exemplary circuit structure of the reference voltage generator 20. The mode selector 10 applies a first control pulse to the control gate of the second write MOS transistor M2w in order to set the second MOS transistors M2w and M2r in the initial state, which has been described with reference to FIG. 14. During the adjust sequence (2), the switches are controlled as follows.

SW1: VSS
SW2: VSS
SW3: OPEN
SW4: SHORT
SW5, SW7: OPEN
SW9: AS DESIRED
SW10: VPP

<Check Sequence>

Note that the states of the second MOS transistors M2w and M2r during the adjust sequence (2) and a later-described adjust sequence (3) can be identified by monitoring the reference voltage Vref output from the reference voltage generator 20.

Figure 20:
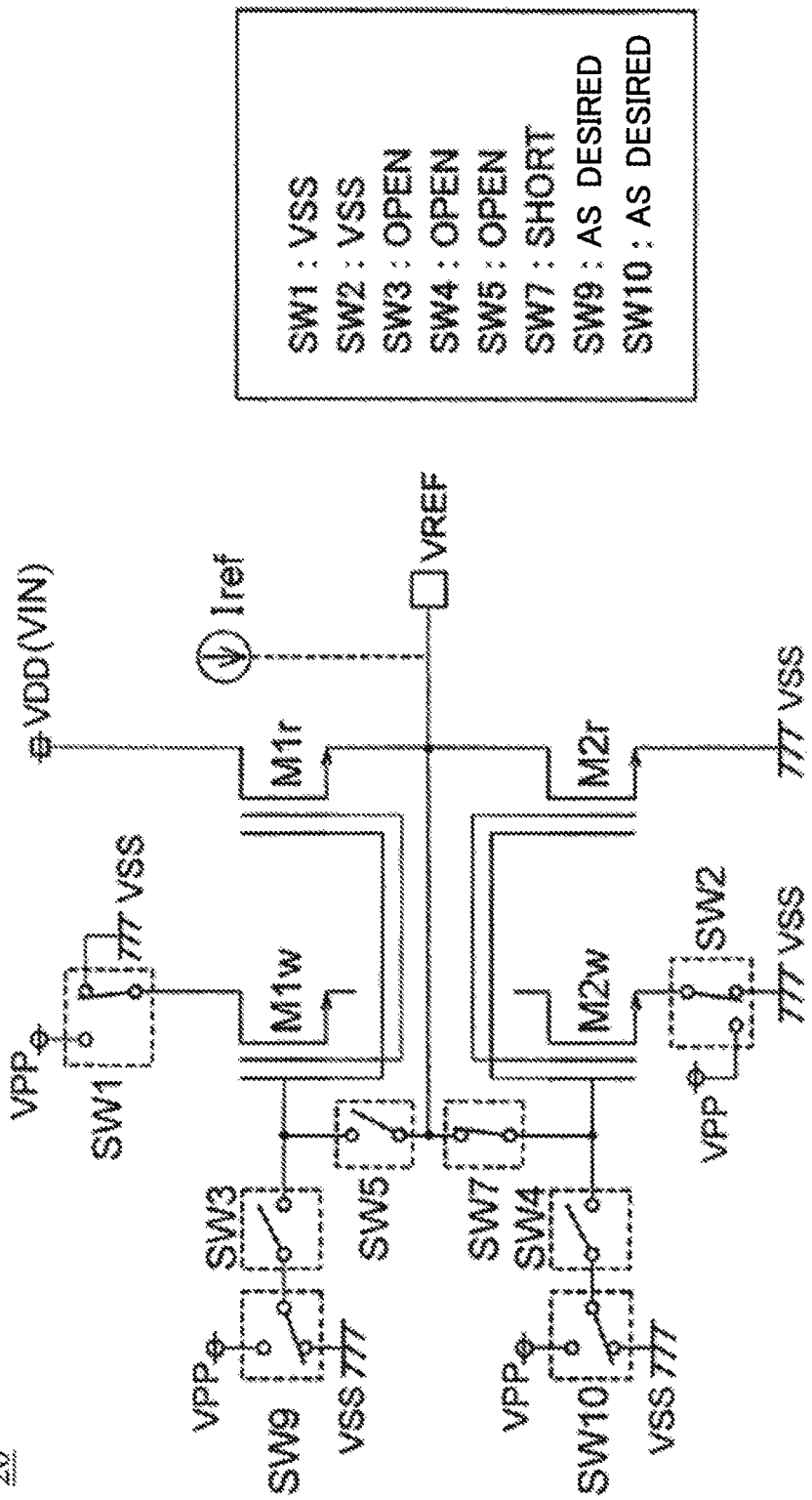
FIG. 20 shows an exemplary circuit structure of the reference voltage generator 20.

FIG. 20 shows an exemplary circuit structure of the reference voltage generator 20. In the present exemplary embodiment, the voltage detector 100 injects the adjust current Iref into the second output MOS transistor M2r in order to check the reference voltage Vref output from the reference voltage generator 20. In the check sequence, the switches are controlled as follows.

SW1, SW2: VSS
SW3, SW4, SW5: OPEN
SW7: SHORT
SW9, SW10: AS DESIRED

Figure 21:
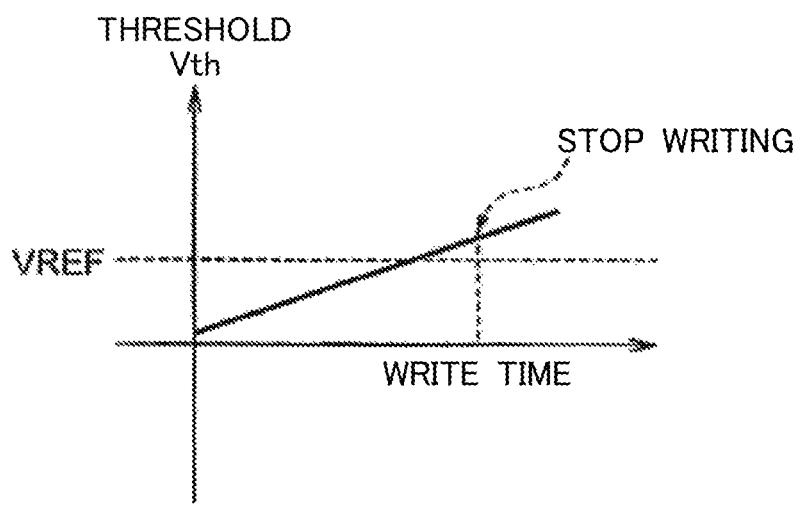
FIG. 21 shows how much a threshold voltage Vth varies in relation to a write time.

FIG. 21 shows how much the threshold voltage Vth varies in relation to the write time of the first control pulse during the adjust sequence (2). The vertical axis represents the threshold voltages Vth of the second MOS transistors M2w and M2r, and the horizontal axis represents the write time of the first control pulse into the second MOS transistors M2w and M2r.

The threshold voltages Vth of the second MOS transistors M2w and M2r vary over time as shown in FIG. 21 as the write time of the first control pulse increases. The mode selector 10 keeps generating the first control pulse until the initial state described with reference to FIG. 14 is achieved.

<Adjust Sequence (3)>

Figure 22:
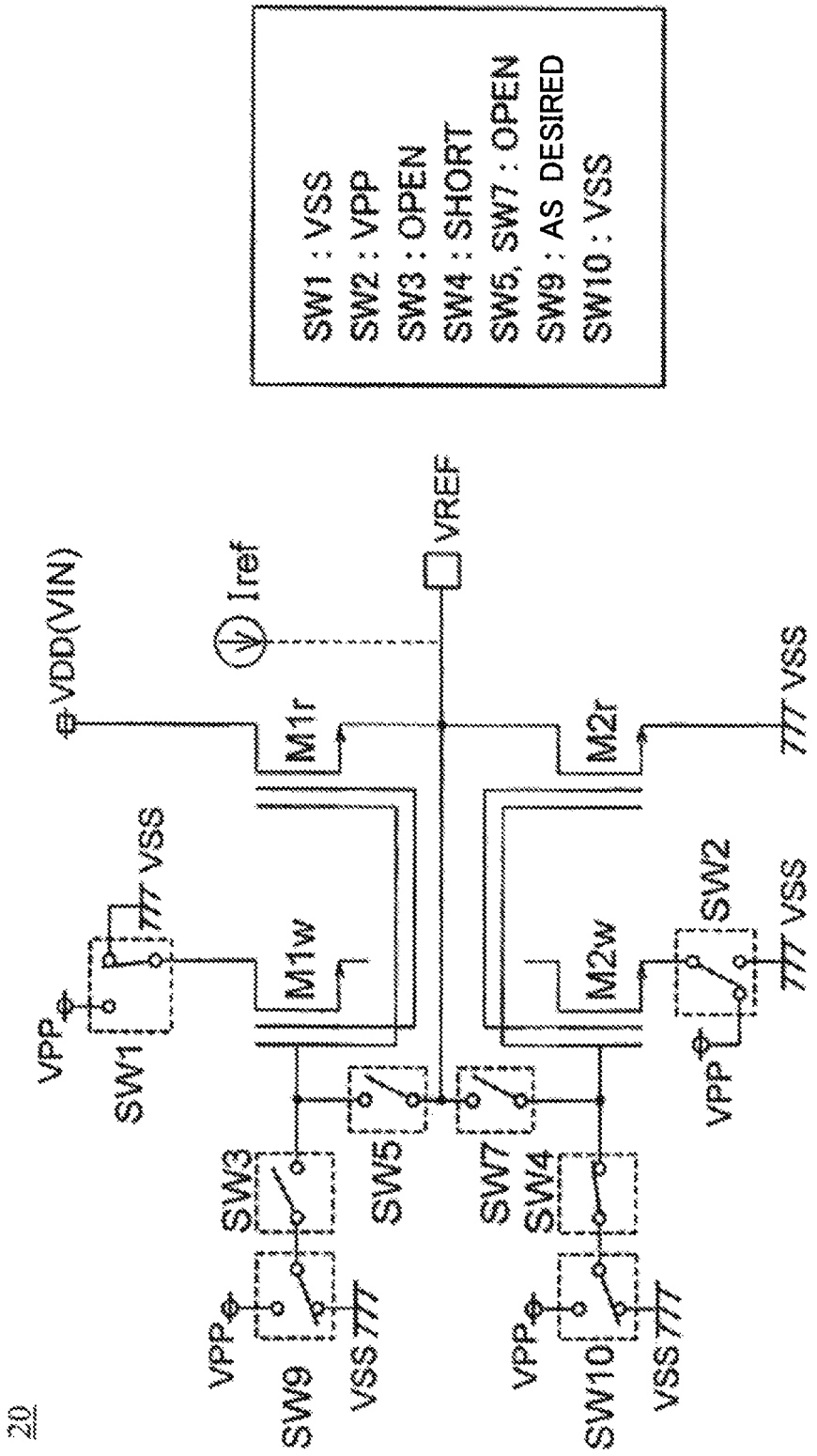
FIG. 22 shows an exemplary circuit structure of the reference voltage generator 20.

FIG. 22 shows an exemplary circuit structure of the reference voltage generator 20. The mode selector 10 applies the second control pulse to the control gate of the second write MOS transistor M2w in order to bring the reference voltage Vref output from the reference voltage generator 20 closer to a predetermined end voltage, as described with reference to FIG. 14. During the adjust sequence (3), while the second control pulse is being applied, the adjust current Iref is injected into the second output MOS transistor M2r. During the adjust sequence (3), the switches are controlled as follows. When the reference voltage Vref falls too below a predetermined voltage, the first control pulse is applied to the control gate of the second write MOS transistor M2w to raise the reference voltage Vref.

SW1: VSS
SW2: VPP
SW3: OPEN
SW4: SHORT
SW5, SW7: OPEN
SW9: AS DESIRED
SW10: VSS

Figure 23:
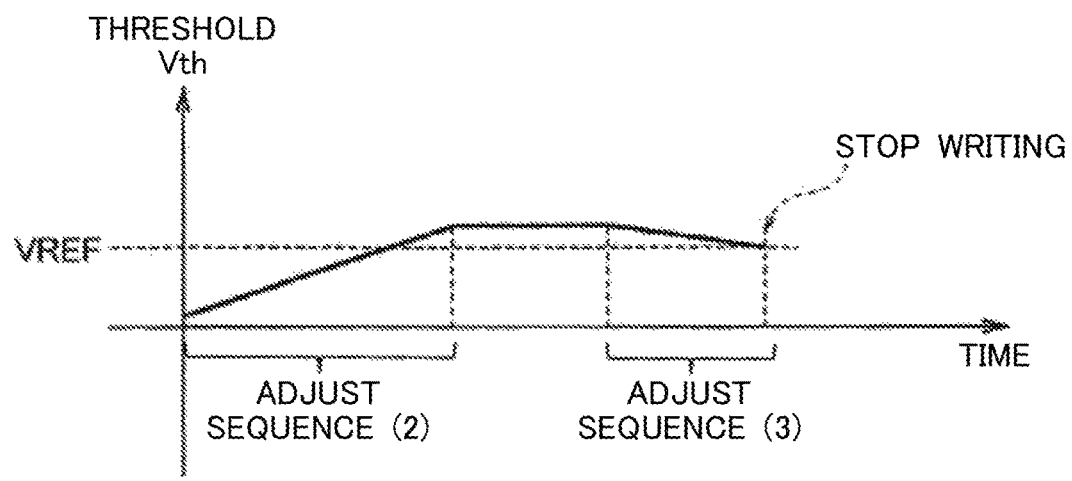
FIG. 23 shows how the threshold voltages Vth vary in relation to the write time.

FIG. 23 shows how the threshold voltages Vth vary during the adjust sequences (2) and (3). The vertical axis represents the threshold voltages Vth of the second MOS transistors M2w and M2r, and the horizontal axis represents the time.

Under the conditions shown in FIG. 22, the threshold voltages Vth of the second MOS transistors M2w and M2r drop as the write time of the second control pulse increases, as shown in the adjust sequence (3) in FIG. 23. The threshold voltages Vth of the second MOS transistors M2w and M2r are adjusted to become equal to the reference voltage Vref by adjusting the write time.

Figure 24:
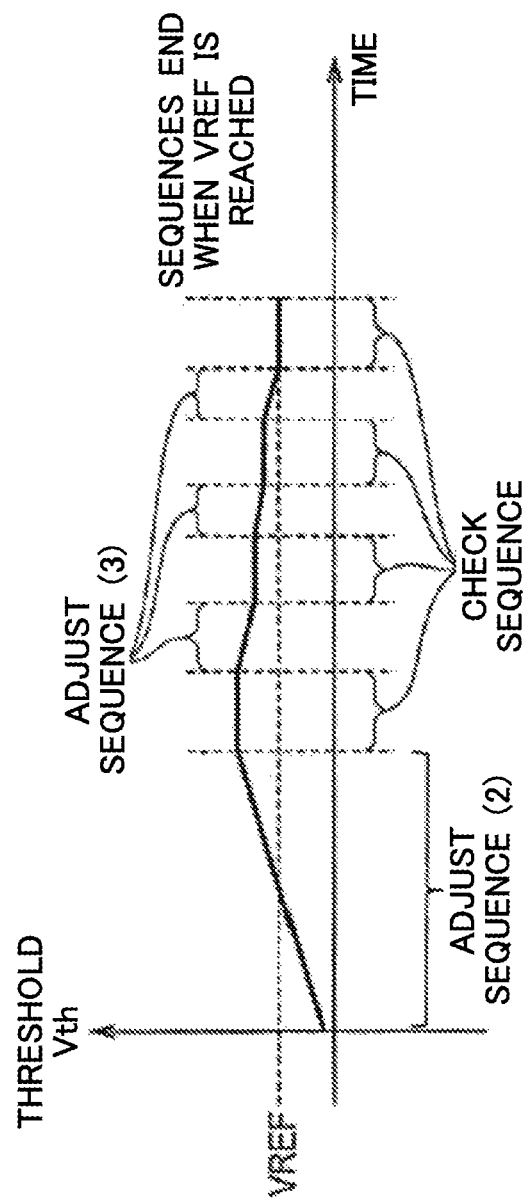
FIG. 24 shows how the reference voltage Vref transitions in relation to an adjust time.

FIG. 24 shows how the threshold voltages Vth vary when the adjust sequence (3) and the check sequence are alternately performed. During the check sequence, the reference voltage Vref does not very since no control pulse is applied to the control gate of the second write MOS transistor M2w. The mode selector 10 may control the pulse width and the voltage of the second control pulse, which is generated during the adjust sequence (3), based on the reference voltage Vref checked in the immediately preceding check sequence.

The adjust sequence (3) ends when the reference voltage Vref output from the reference voltage generator 20 reaches a predetermined value. In this manner, the adjustment of the second MOS transistors M2w and M2r is completed. Next, the first MOS transistors M1w and M1r are adjusted.

<Adjust Sequence (4)>

Figure 25:
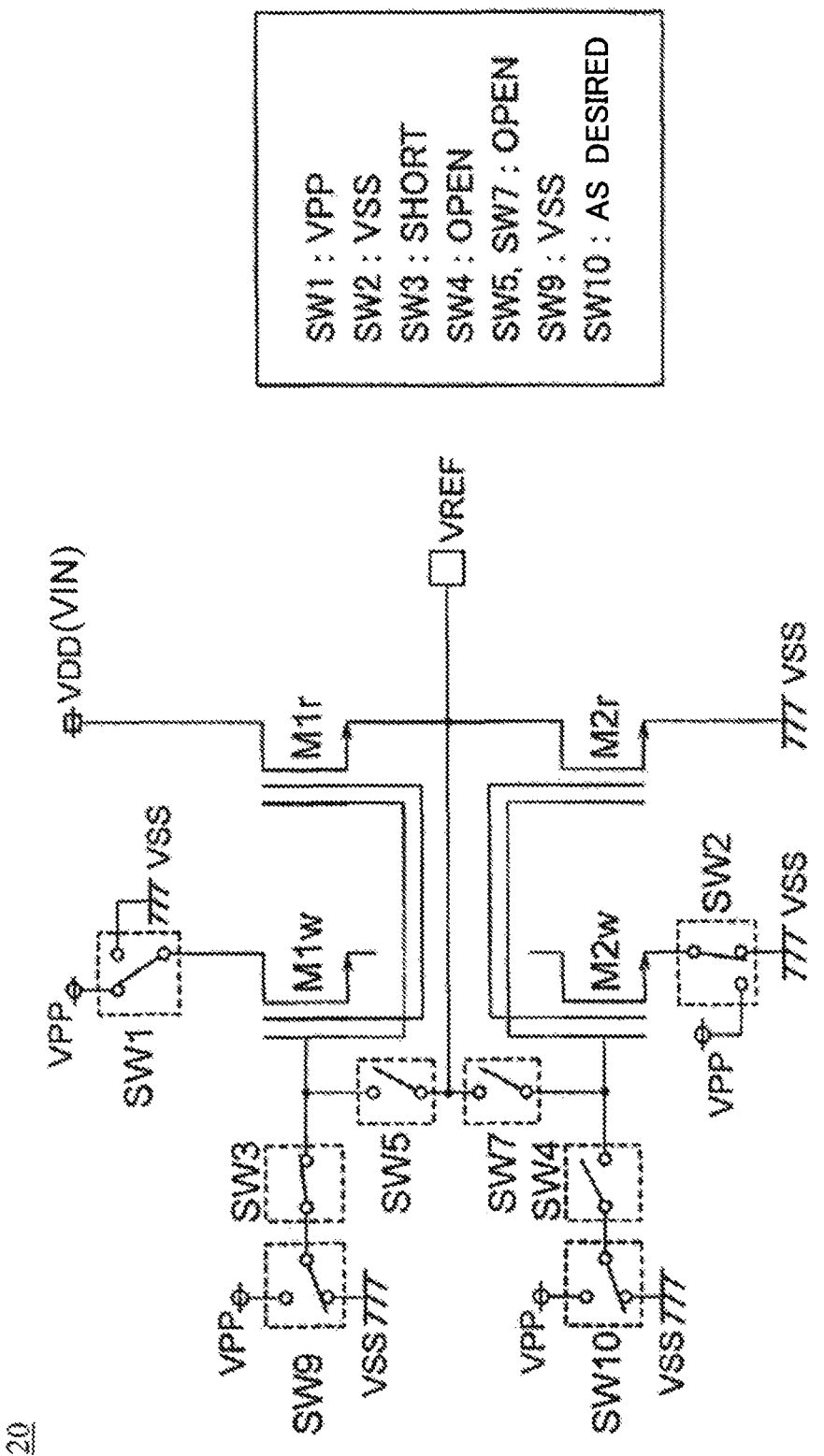
FIG. 25 shows an exemplary circuit structure of the reference voltage generator 20.

FIG. 25 shows an exemplary circuit structure of the reference voltage generator 20. The mode selector 10 applies a first control pulse to the control gate of the first write MOS transistor M1w in order to set the first MOS transistors M1w and M1r in the initial state described with reference to FIG. 16. During the adjust sequence (4), the switches are controlled as follows.

SW1: VPP
SW2: VSS
SW3: SHORT
SW4, SW5, SW7: OPEN
SW9: VSS
SW10: AS DESIRED

<Adjust Sequence (5)>

Figure 26:
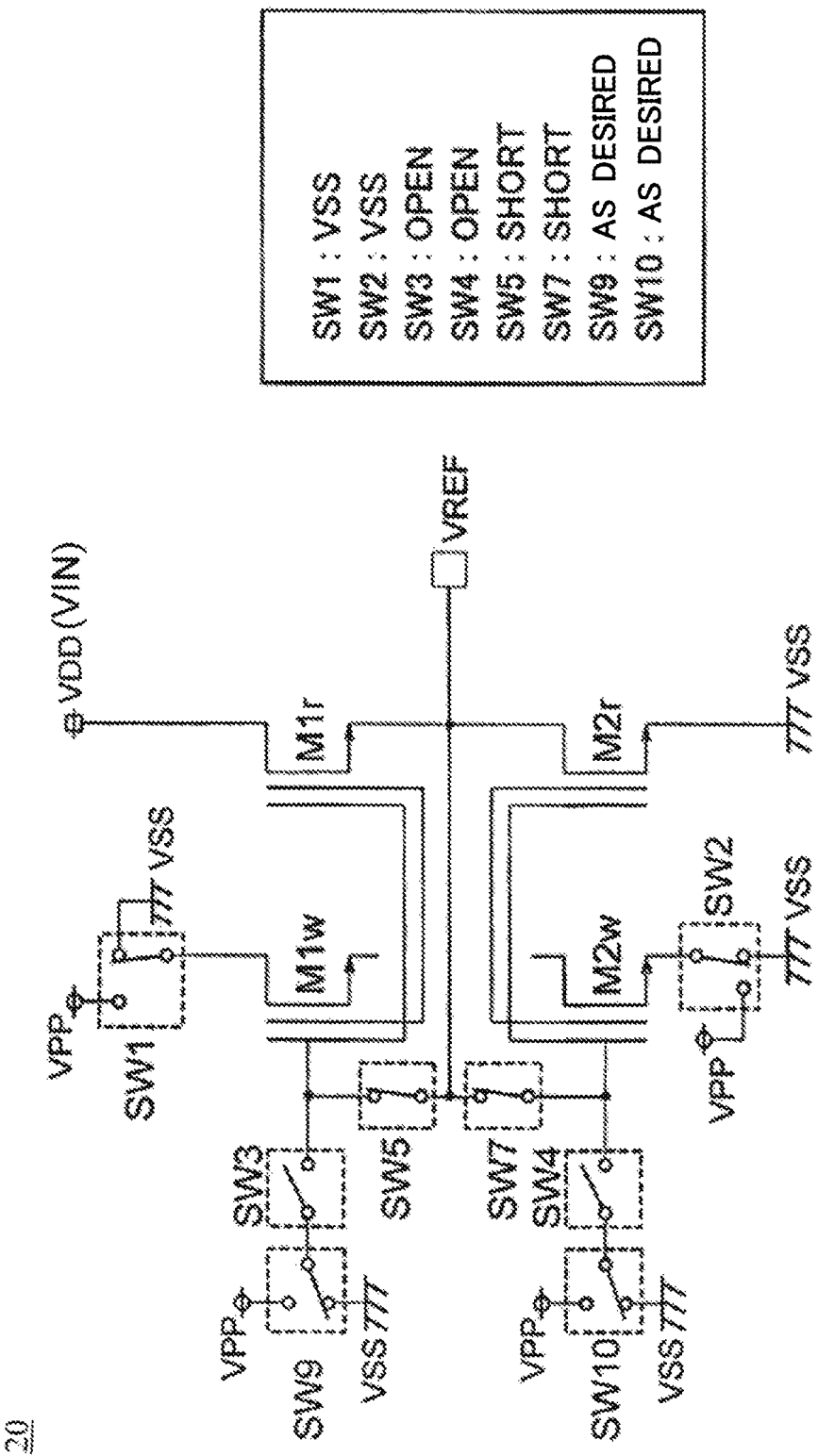
FIG. 26 shows an exemplary circuit structure of the reference voltage generator 20.

FIG. 26 shows an exemplary circuit structure of the reference voltage generator 20. The mode selector 10 applies a second control pulse to the control gate of the first write MOS transistor M1w in order to bring the reference voltage Vref output from the reference voltage generator 20 closer to a predetermined end voltage, as described with reference to FIG. 16. During the adjust sequences (4) and (5), the adjust current Iref is not injected from outside. However, the first MOS transistors M1w and M1r generate currents corresponding to the adjust current Iref. During the adjust sequence (5), the switches are controlled as follows.

SW1, SW2: VSS
SW3, SW4: OPEN
SW5, SW7: SHORT
SW9, SW10: AS DESIRED

Figure 27:
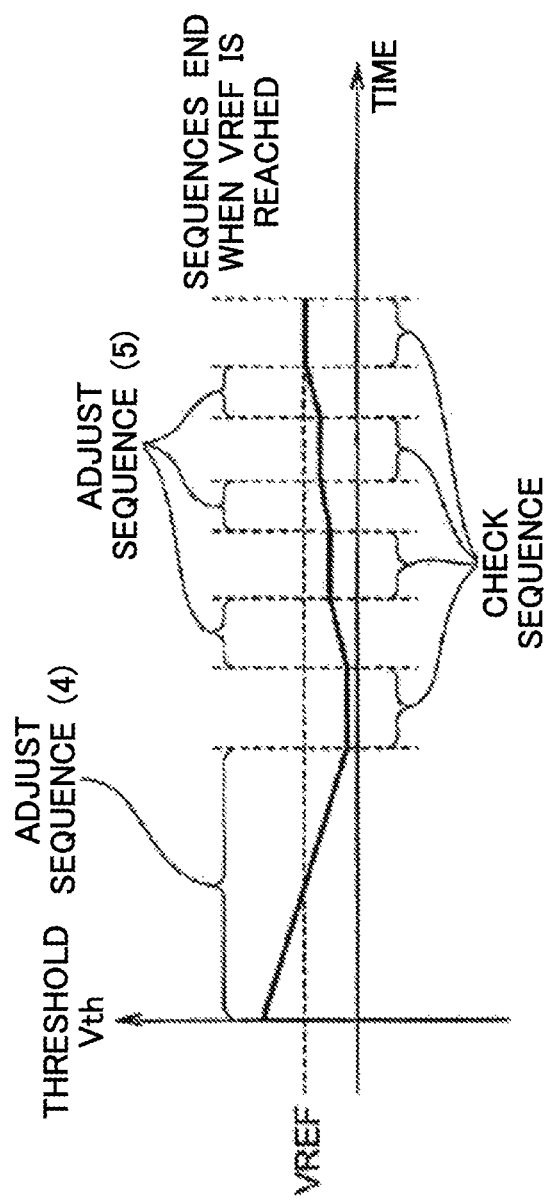
FIG. 27 shows how the reference voltage Vref transitions in relation to the adjust time.

FIG. 27 shows how the threshold voltages Vth vary during the adjust sequences (4) and (5). The vertical axis represents the threshold voltages Vth of the first MOS transistors M1w and M1r and the horizontal axis represents the time. During the adjust sequence (4), the threshold voltages Vth of the first MOS transistors M1w and M1r drop over time as shown in FIG. 27 as the write time of the first control pulse increases. The mode selector 10 keeps generating the first control pulse until the initial state described with reference to FIG. 16 is achieved.

During the adjust sequence (5), the threshold voltages Vth of the first MOS transistors M1w and M1r rise as the write time of the second control pulse increases. The threshold voltages Vth of the first MOS transistors M1w and M1r are adjusted to become equal to the reference voltage Vref by adjusting the write time. During the check sequence, the reference voltage Vref does not vary since no control pulse is applied to the control gate of the first write MOS transistor M1w. The mode selector 10 may control the pulse width and the voltage of the second control pulse, which is generated during the adjust sequence (5), based on the reference voltage Vref checked in the immediately preceding check sequence.

The adjust sequence (5) ends when the reference voltage Vref output from the reference voltage generator 20 reaches a predetermined value. In this way, the adjustment of the first MOS transistors M1w and M1r is completed, and the adjustment of the reference voltage generator 20 is completed. Here, when the reference voltage Vref is checked during the adjust sequences (4) and (5), the switches may be controlled in the same manner as when the voltage detector 100 is in the actual operation mode. For example, the switches are controlled in the same manner as in the example shown in FIG. 9.

Figure 28:
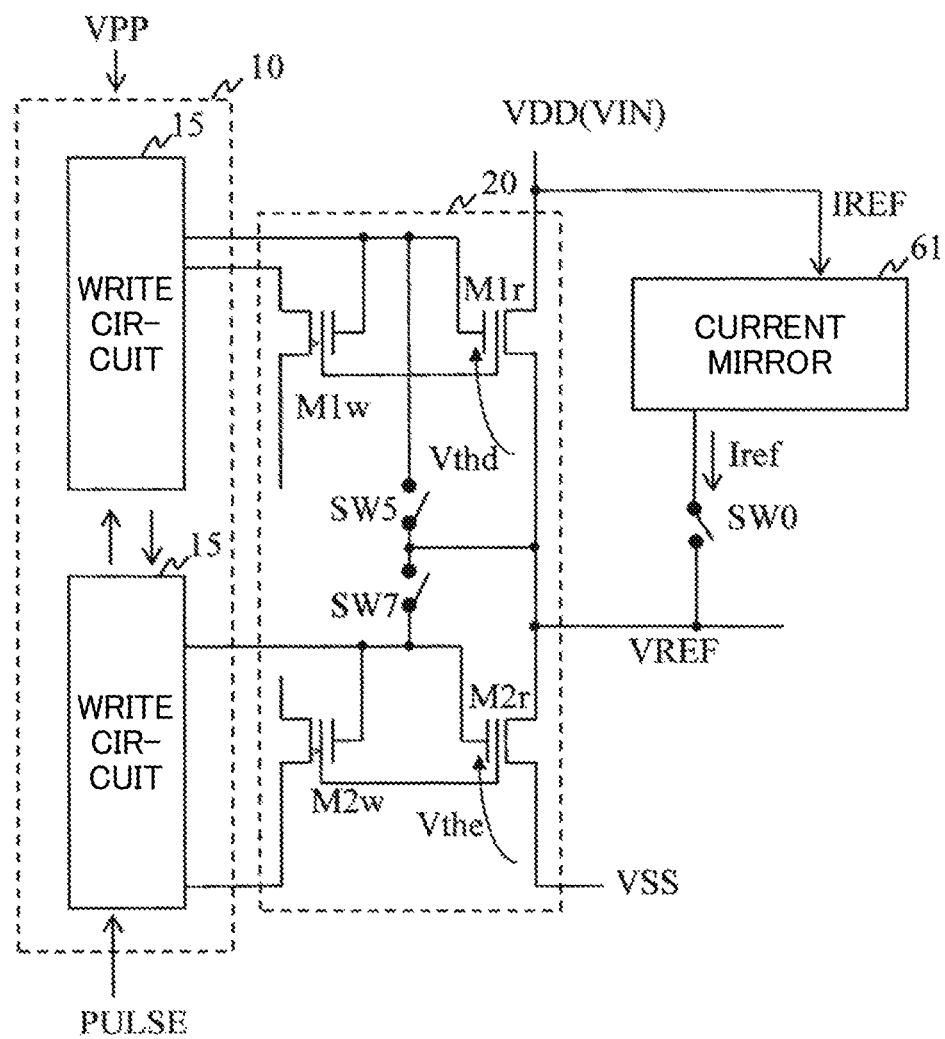
FIG. 28 shows an exemplary structure of the voltage detector 100.

FIG. 28 shows, as an example, how the current mirror 61 is connected. In the present exemplary embodiment, the mode selector 10 includes a write circuit 15, which is configured to operate as a gate controller. The write circuit 15 controls the switches SW1 to SW10 described with reference to FIGS. 9 to 27 in order to input a control pulse into the control gates of the first write MOS transistor M1w and the second write MOS transistor M2w of the reference voltage generator 20.

In the reference voltage setting mode, the current mirror 61 generates the adjust current Iref based on the external current IREF input from outside the voltage detector 100. Here, the adjust current Iref is smaller than the external current IREF. For example, the current mirror 61 generates the adjust current Iref that is 1/n times as large as the external current IREF based on the external current IREF input from outside the voltage detector 100. In the present exemplary embodiment, the current mirror 61 and the first output MOS transistor M1r are connected to a common external terminal. The current mirror 61 generates the minute adjust current Iref, which is smaller than the external current IREF, based on the external current IREF input from this external terminal.

Between the current mirror 61 and the output terminal of the reference voltage generator 20, a switch SW0 is arranged. The mode selector 10 controls the switch SW0 in the respective adjust sequences. For example, during the adjust sequence (3), the mode selector 10 turns on the switch SW0. During the adjust sequences (4) and (5), the mode selector 10 turns off the switch SW0 to stop the adjust current Iref from flowing through the second output MOS transistor M2r.

According to the method of setting the reference voltage relating to the present exemplary embodiment, the electric charges accumulated in the floating gates of the first MOS transistors M1w and M1r are set in the reference state during the adjust sequence (1), and the adjust current Iref is input into the second output MOS transistor M2r during the adjust sequence (3). Accordingly, while the adjust current IRef flows through the second output MOS transistor M2r, no currents flow from the first output MOS transistor M1r to the second output MOS transistor M2r. In this manner, the second MOS transistors M2w and M2r are set more accurately. This eliminates the necessity of providing at the drain end of the first output MOS transistor M1r a switch configured to stop the influence of the electric charges accumulated in the depletion-mode MOS transistor M1r.

Figure 29:
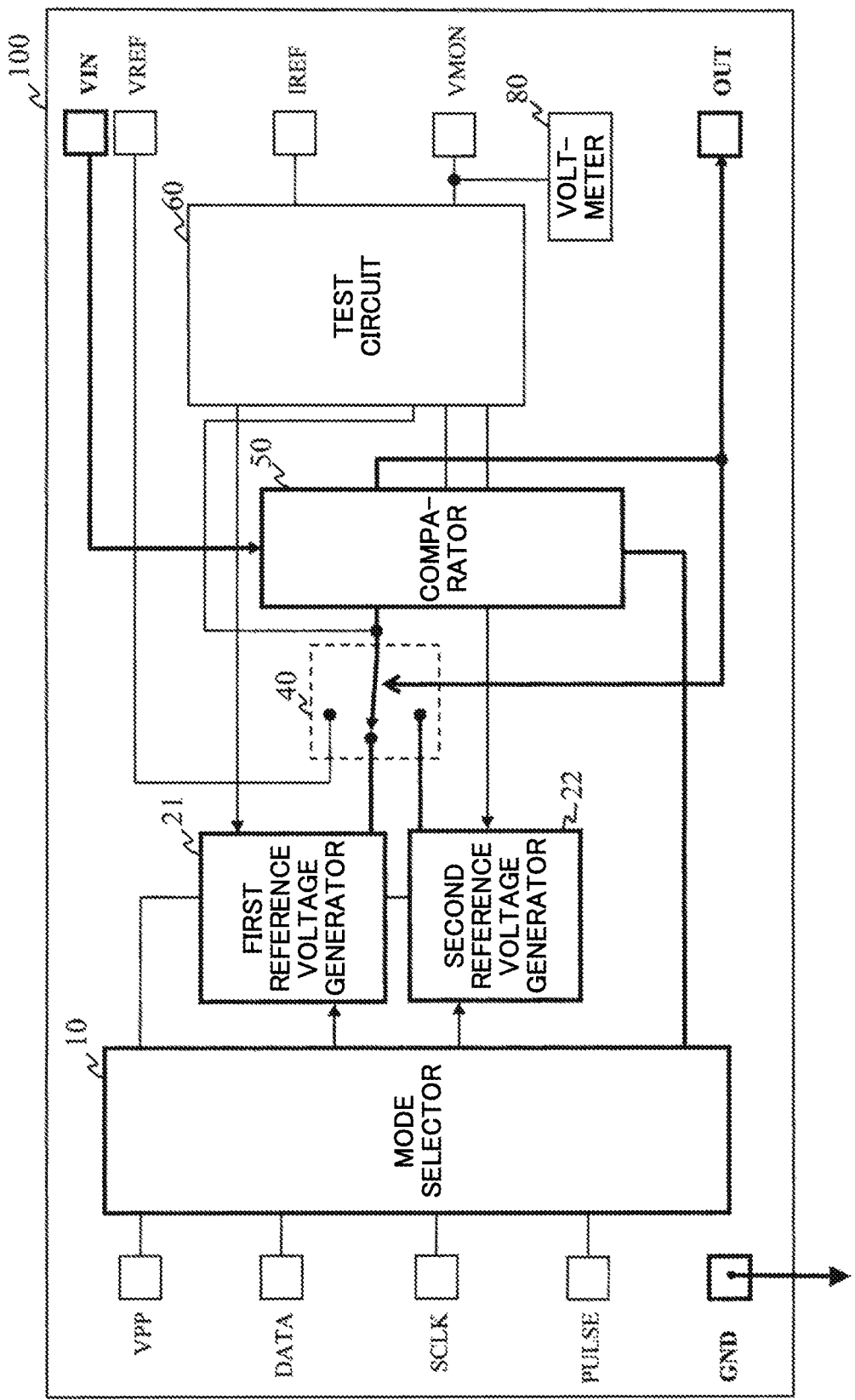
FIG. 29 shows an exemplary structure of the voltage detector 100 in an actual operation mode.

FIG. 29 shows an exemplary structure of the voltage detector 100 in the actual operation mode. When the mode selector 10 selects the actual operation mode, the voltage detector 100 uses the VIN terminal, the OUT terminal and the GND terminal. The voltage detector 100 detects whether the voltage input from the VIN terminal is no lower than a predetermined target voltage and outputs the result to the OUT terminal.

The first reference voltage generator 21 outputs the reference voltage VrefH. The second reference voltage generator 22 outputs the reference voltage VrefL. The reference voltage (VrefH, VrefL) and the input voltage Vin are input into the comparator 50. The comparator 50 outputs to the OUT terminal a signal determined according to the reference voltage (VrefH, VrefL) and the input voltage Vin.

The voltage selector 40 selects the reference voltage (VrefH, VrefL) depending on the output from the comparator 50. The voltage selector 40 inputs the selected reference voltage (VrefH, VrefL) to the comparator 50. In this manner, the target voltage of the CMOS inverter 51 varies according to the output from the comparator 50 in order to achieve hysteresis.

Figure 30:
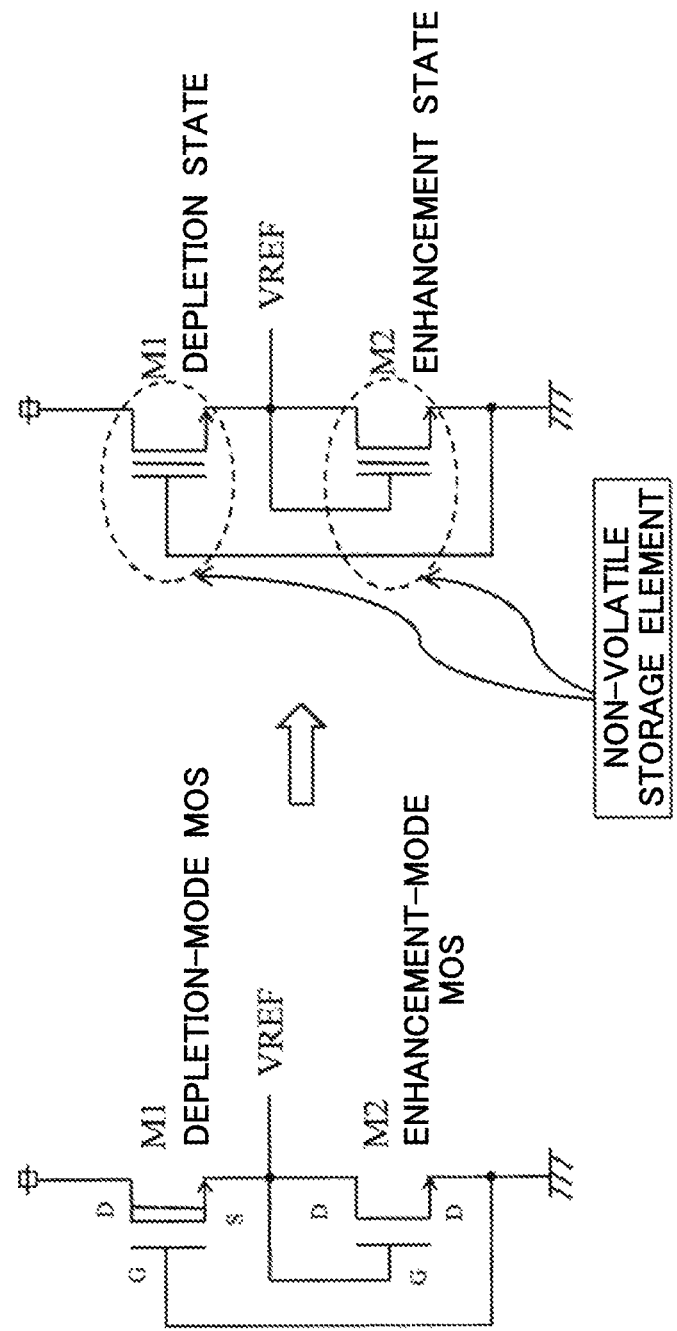
FIG. 30 shows a different exemplary connection between a first MOS transistor M1 and a second MOS transistor M2 in the reference voltage generator 20.

FIG. 30 shows a different exemplary connection between the first MOS transistor M1 and the second MOS transistor M2 in the reference voltage generator 20. Here, the first MOS transistor M1 and the second MOS transistor M2 shown in the left view in FIG. 30 are the same elements as the first MOS transistor M1 and the second MOS transistor M2 shown in the left view in FIG. 6. The first MOS transistor M1 and the second MOS transistor M2 shown in the right view in FIG. 30 are the same non-volatile storage elements as the first MOS transistor M1 and the second MOS transistor M2 shown in the right view in FIG. 6.

In the present exemplary embodiment, the gate of the first MOS transistor M1 is connected to the source of the second MOS transistor M2. In addition, the source of the first MOS transistor M1, the drain of the second MOS transistor M2 and the gate of the second MOS transistor M2 are connected to each other. The reference voltage generator 20 outputs the reference voltage Vref from this connection point.

The first write and output MOS transistors M1 and the second write and output MOS transistors M2 shown in FIG. 9 may be connected in the same manner as the first MOS transistor M1 and the second MOS transistor M2 shown in FIG. 30. In this case, the first write and output MOS transistors M1 and the second write and output MOS transistors M2 can be set in the same manner as described with reference to FIGS. 1 to 29.

Figure 31:
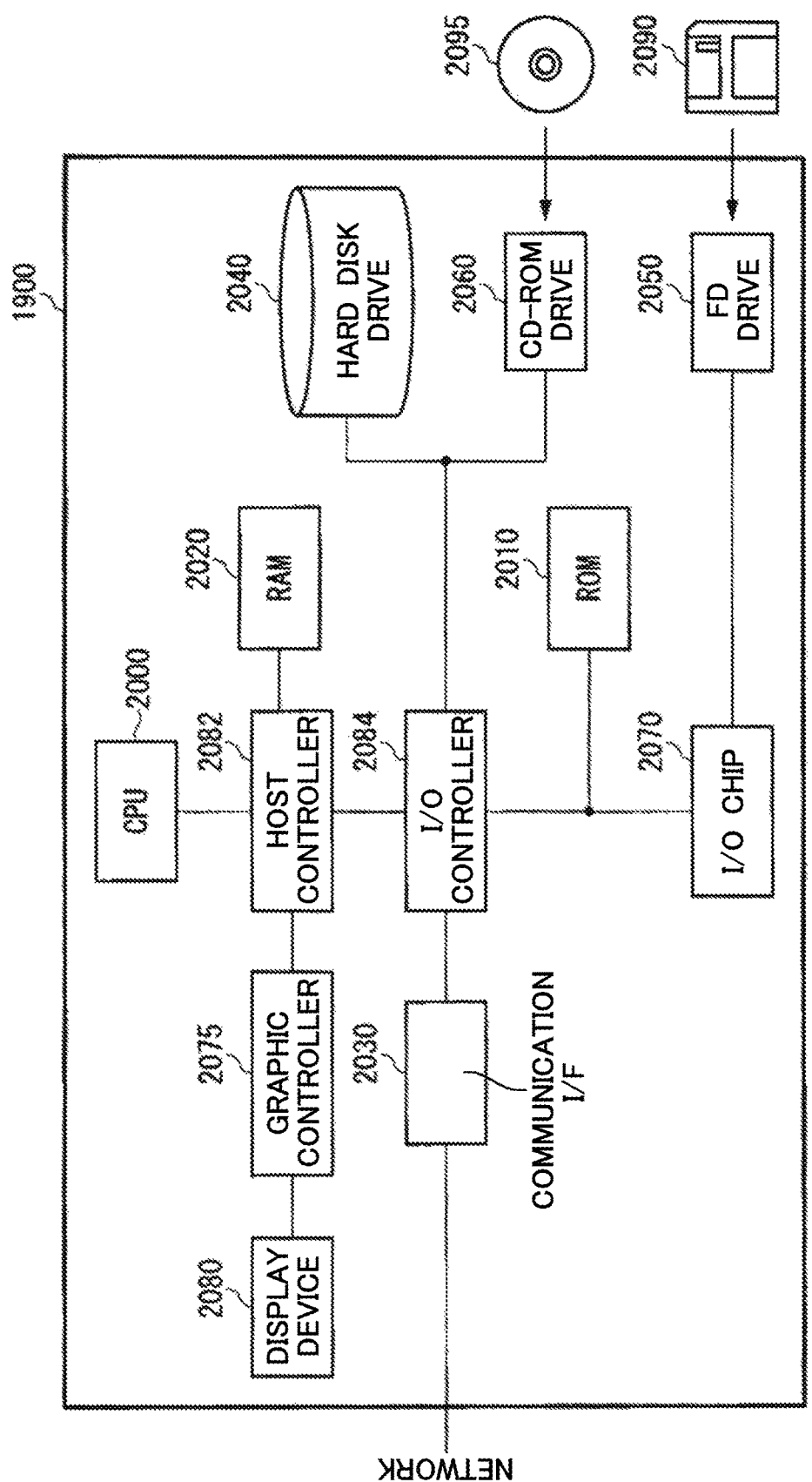
FIG. 31 shows an exemplary hardware structure of a computer 1900 relating to an embodiment of the present invention.

FIG. 31 shows an exemplary hardware structure of a computer 1900 relating to an embodiment of the present invention. The computer 1900 relating to the present exemplary embodiment includes a CPU peripheral unit including a CPU 2000, RAM 2020, a graphic controller 2075, and a display device 2080 interconnected to each other by means of a host controller 2082, an input/output unit including a communication interface 2030, a hard disk drive 2040, and a CD-ROM drive 2060 connected to the host controller 2082 by means of an input/output controller 2084, and a legacy input/output unit including ROM 2010, a flexible disk drive 2050 and an input/output chip 2070 connected to the input/output controller 2084.

The host controller 2082 connects the RAM 2020 to the CPU 2000 and the graphic controller 2075 which access the RAM 2020 at high transfer rates. The CPU 2000 operates based on the programs stored on the ROM 2010 and the RAM 2020 to control the individual components. The graphic controller 2075 retrieves the image data generated by the CPU 2000 or the like on the frame buffer provided in the RAM 2020 and causes the display device 2080 to display the retrieved image data. Alternatively, the graphic controller 2075 may include therein the frame buffer for storing the image data generated by the CPU 2000 or the like.

The input/output controller 2084 connects the host controller 2082 to the communication interface 2030, the hard disk drive 2040 and the CD-ROM drive 2060, which are relatively high-speed input/output devices. The communication interface 2030 communicates with other devices through a network. The hard disk drive 2040 stores the programs and data to be used by the CPU 2000 in the computer 1900. The CD-ROM drive 2060 reads programs or data from the CD-ROM 2095 and provides the read programs or data to the hard disk drive 2040 through the RAM 2020.

The input/output controller 2084 is connected to the ROM 2010, the flexible disk drive 2050, and the input/output chip 2070, which are relatively low-speed input/output devices. The ROM 2010 stores thereon boot programs to be executed at the startup of the computer 1900 and/or programs and the like determined by the hardware of the computer 1900. The flexible disk drive 2050 reads programs or data from the flexible disk 2090 and provides the read programs or data to the hard disk drive 2040 through the RAM 2020. The input/output chip 2070 connects the flexible disk drive 2050 to the input/output controller 2084 and also connects various types of input/output devices to the input/output controller 2084 through, for example, parallel ports, serial ports, keyboard ports, mouse ports and the like.

The programs provided to the hard disk drive 2040 through the RAM 2020 are provided by the user in the state of being stored in storage media such as the flexible disk 2090, the CD-ROM 2095, the IC card or the like. The programs are read from the storage media, installed in the hard disk drive 2040 in the computer 1900 through the RAM 2020, and executed by the CPU 2000.

The programs that are installed in the computer 1900 and designed to cause the computer 1900 to control the voltage detector 100 are executed to control the CPU 2000 or the like to cause the computer 1900 to perform the setting methods described with reference to FIGS. 1 to 30. For example, the computer 1900 receives information indicating the target voltage from the user or the like. The computer 1900 controls the voltage detector 100 in order to set the received target voltage in the voltage detector 100 and controls signal sources outside the voltage detector 100 in order to supply the voltage detector 100 with predetermined signals, voltages and currents.

By being read by the computer 1900, the information processing described in the programs functions as a control apparatus, which is concrete means achieved by cooperation between software and the above-described various types of hardware resources. The concrete means realizes the operations or processing of the information suitable for the use purposes of the computer 1900 relating to the present exemplary embodiment. In this manner, a special control device suitable for the use purposes is constructed.

For example, to conduct communication between the computer 1900 and an external device or the like, the CPU 2000 executes a communication program loaded onto the RAM 2020 and instructs the communication interface 2030 to perform communication based on the processing described in the communication program. Under the control of the CPU 2000, the communication interface 2030 reads transmission data stored on the transmission buffer region and the like provided in storage devices such as the RAM 2020, the hard disk drive 2040, the flexible disk 2090, or the CD-ROM 2095 and transmits the read transmission data to the network, or receives reception data from the network and write the reception data into the reception buffer region and the like provided in the storage devices. As described above, the communication interface 2030 may transfer the transmission/reception data to/from the storage devices using the direct memory access (DMA) technique. Alternatively, the transmission and reception data may be transferred in such a manner that the CPU 2000 may read data from the source such as storage devices or the communication interface 2030 and write the data into the destination such as the communication interface 2030 or storage devices The CPU 2000 uses the DMA transfer technique or the like to read to the RAM 2020 all or necessary portions of the files or databases or the like stored on the external storage devices such as the hard disk drive 2040, the CD-ROM drive 2060 (the CD-ROM 2095), the flexible disk drive 2050 (the flexible disk 2090) and the like and performs various operations on the data stored on the RAM 2020. The CPU 2000 writes the processed data back into the external storage devices using the DMA transfer technique and the like. In such a series of steps, the RAM 2020 can be considered to temporarily store thereon the contents of the external storage devices. Thus, in the present embodiment, the RAM 2020 and the external storage devices and the like may be collectively referred to as memory, a storage unit, a storage device or the like. In the present embodiment, various types of information such as various types of programs, data, tables, databases and the like are stored on such storage devices and to be processed. Here, the CPU 2000 can also store part of the RAM 2020 in cache memory and perform write and read operations on the cache memory. In such an embodiment, the cache memory carries part of the functions of the RAM 2020. Therefore, the cache memory is also included in the RAM 2020, memory and/or storage devices in the present embodiment unless clearly stated otherwise.

The CPU 2000 performs, on the data read from the RAM 2020, various operations including various logic and arithmetic operations, information processing, conditional judgments, information searching/replacement described in the present specification, which are designated by instruction sequences in the programs, and writes the results back into the RAM 2020. For example, in the case of conditional judgments, the CPU 2000 judges whether various variables mentioned in the present specification satisfy various conditions, for example, judges whether the variables are larger, smaller, no less than, no more than, equal to other variables or constants, and if the conditions are satisfied (or not satisfied), executes a different branch instruction sequence or calls a subroutine.

The CPU 2000 can also search the information stored on the files or databases within the storage devices. For example, when the storage devices store thereon a plurality of entries, in each of which an attribute value of a first attribute is associated with an attribute value of a second attribute, the CPU 2000 searches the entries stored on the storage devices for an entry having an attribute value of the first attribute that matches the designated condition and reads the attribute value of the second attribute stored in the entry. In this manner, the CPU 2000 can retrieve the attribute value of the second attribute associated with the attribute value of the first attribute that satisfies the predetermined condition.

The above-described programs or modules may be stored on external storage media. The storage media can include, in addition to the flexible disk 2090, the CD-ROM 2095, optical storage media such as DVD and CD, magnetooptical storage media such as MO, tape media, semiconductor memory such as IC cards and the like. Alternatively, the storage media may include storage devices such as hard disk or RAM provided in server systems connected to dedicated communication networks or the Internet. In this case, the programs may be provided to the computer 1900 via the networks.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a voltage detector for detecting whether an input voltage is no lower than a predetermined threshold voltage, a method for setting a reference voltage and a computer readable medium.

What is claimed is:

1. A voltage detector for detecting whether an input voltage is no lower than a predetermined threshold voltage, comprising:
    a reference voltage generator configured to generate a reference voltage; and
    a comparator configured to receive the input voltage and the reference voltage and to detect whether the input voltage is no lower than the threshold voltage that is determined by the reference voltage, wherein
    the reference voltage generator includes:
    a first write MOS transistor including a control gate and a floating gate;
    a second write MOS transistor connected in series with the first write MOS transistor, the second write MOS transistor including a control gate and a floating gate;
    a first output MOS transistor including a control gate and a floating gate that are electrically connected to the control gate and the floating gate of the first write MOS transistor; and
    a second output MOS transistor connected in series with the first output MOS transistor, the second output MOS transistor including a control gate and a floating gate that are electrically connected to the control gate and the floating gate of the second write MOS transistor,
    the first write MOS transistor and the second write MOS transistor each include a tunnel oxide film that allows electric charges to tunnel therethrough to be injected into the floating gates, and
    the first output MOS transistor and the second output MOS transistor do not include the tunnel oxide film and the reference voltage is output from a connection point between the first output MOS transistor and the second output MOS transistor.

2. The voltage detector as set forth in claim 1, wherein the comparator includes a CMOS inverter,
    the reference voltage is input into an input terminal of the CMOS inverter, and
    the input voltage is input into a power supply terminal of the CMOS inverter.

3. The voltage detector as set forth in claim 2, further comprising
    a voltage selector configured to select one of the reference voltage and a gradually changing setting voltage and to input the selected voltage into the input terminal, wherein the voltage detector operates in (i) a reference voltage detection mode to detect a voltage that needs to be input into the input terminal of the comparator in order to allow the comparator to operate according to the threshold voltage and (ii) an actual operation mode to detect whether the input voltage is no lower than the threshold voltage, and the voltage selector:

selects and input the setting voltage into the input terminal when the voltage detector operates in the reference voltage detection mode; and selects and inputs the reference voltage into the input terminal when the voltage detector operates in the actual operation mode.

4. The voltage detector as set forth in claim 3, wherein in a case where the input voltage is equal to a predetermined first threshold voltage while the voltage detector operates in the reference voltage detection mode, the reference voltage generator sets, as the reference voltage, the setting voltage that is observed when the output of the CMOS inverter is inverted.

5. The voltage detector as set forth in claim 4, wherein the voltage detector is configured to operate further in a reference voltage setting mode in which the reference voltage is set in the reference voltage generator.

6. The voltage detector as set forth in claim 5, further comprising
a gate controller configured to, when the voltage detector operates in the reference voltage setting mode, control a state of electric charges stored in the floating gate of the first write MOS transistor in such a manner that the reference voltage output from the reference voltage generator becomes equal to the setting voltage detected while the voltage detector operates in the reference voltage detection mode.

7. The voltage detector as set forth in claim 6, further comprising
a current mirror configured to, when the voltage detector operates in the reference voltage setting mode, generate an adjust current based on an external current input from outside the voltage detector, the adjust current being smaller than the external current, wherein
the gate controller inputs the adjust current into the second output MOS transistor to control the state of the electric charges stored in the floating gate of the second write MOS transistor in such a manner that the reference voltage output from the reference voltage generator becomes equal to a predetermined voltage, after which, while the adjust current is prevented from being input into the second output MOS transistor, the gate controller controls the state of the electric charges stored in the floating gate of the first write MOS transistor in such a manner that the reference voltage output from the reference voltage generator becomes equal to a predetermined voltage.

8. The voltage detector as set forth in claim 4, further comprising
another reference voltage generator configured to generate another reference voltage that is different from the reference voltage, wherein
when the voltage detector operates in the actual operation mode, the voltage selector selects one of the reference voltage and the other reference voltage according to the output of the CMOS inverter and inputs the selected reference voltage into the input terminal to change the threshold voltage.

9. The voltage detector as set forth in claim 8, wherein when the input voltage is equal to a predetermined second threshold voltage that is different from the first threshold voltage while the voltage detector operates in the reference voltage detection mode, the other reference voltage generator sets as the other reference voltage the setting voltage observed when the output of the CMOS inverter is inverted.

10. The voltage detector as set forth in claim 1, wherein the first write MOS transistor and the first output MOS transistor operate in the enhancement mode and the second write MOS transistor and the second output MOS transistor operate in the depletion mode.

11. The voltage detector as set forth in claim 1, wherein the first write MOS transistor and the second write MOS transistor are non-volatile storage elements.

12. The voltage detector as set forth in claim 1, wherein the reference voltage generator outputs a different reference voltage, and
the voltage detector further comprises a voltage selector configured to select one of the reference voltage and the different reference voltage output from the reference voltage generator, according to the output from the comparator.

13. A method for setting a reference voltage, the method to be used for setting a reference voltage generator including:
a first write MOS transistor including a control gate and a floating gate;
a second write MOS transistor connected in series with the first write MOS transistor, the second write MOS transistor including a control gate and a floating gate;
a first output MOS transistor including a control gate and a floating gate that are electrically connected to the control gate and the floating gate of the first write MOS transistor; and
a second output MOS transistor connected in series with the first output MOS transistor, the second output MOS transistor including a control gate and a floating gate that are electrically connected to the control gate and the floating gate of the second write MOS transistor,
the first write MOS transistor and the second write MOS transistor are non-volatile storage elements each including a tunnel oxide film that allows electric charges to tunnel therethrough to be injected into the floating gate, and
the first output MOS transistor and the second output MOS transistor are non-volatile storage elements each not including the tunnel oxide film and a reference voltage is output from a connection point between the first output MOS transistor and the second output MOS transistor, wherein
electric charges stored in the floating gates of the first write MOS transistor and the first output MOS transistor are set in a reference state in which no currents flow from the first output MOS transistor into the second output MOS transistor,
the second write MOS transistor and the second output MOS transistor enter an enhancement state in response to controlling the state of the electric charges stored in the floating gate through the tunnel oxide film of the second write MOS transistor, and
the first write MOS transistor and the first output MOS transistor enter a depletion state in response to controlling the state of the electric charges stored in the floating gate through the tunnel oxide film of the first write MOS transistor.

14. The method for setting a reference voltage as set forth in claim 13, wherein
   in order to control the second write MOS transistor and the second output MOS transistor to enter the enhancement state,
   a predetermined adjust current is input into the second output MOS transistor while the electric charges stored in the floating gate of the first output MOS transistor are set in the reference state, and
   the state of the electric charges stored in the floating gate of the second write MOS transistor is controlled in such a manner that a reference voltage output from the reference voltage generator becomes equal to a predetermined voltage.

15. The method for setting a reference voltage as set forth in claim 14, wherein
   the adjust current is generated by a current mirror based on an external current that is input from outside the reference voltage generator, and
   the adjust current is smaller than the external current.

16. The method for setting a reference voltage as set forth in claim 14, wherein
   in order to control the first write MOS transistor and the first output MOS transistor to enter the depletion state,
   while the adjust current is prevented from being input into the second output MOS transistor, the state of the electric charges stored in the floating gate of the first write MOS transistor is controlled in such a manner that the reference voltage output from the reference voltage generator becomes equal to a predetermined voltage.

17. The method for setting a reference voltage as set forth in claim 14, wherein
   the state of the electric charges stored in the floating gates is controlled by inputting a control pulse into the control gates, and
   as the output from the reference voltage generator approaches the reference voltage, an intensity of the control pulse is lowered by adjusting at least one of a pulse width and a voltage of the control pulse.

18. The method for setting a reference voltage as set forth in claim 17, wherein
   the control pulse is input into the control gate of the first write MOS transistor in order to control the output from the reference voltage generator to approach the reference voltage, and
   when the output from the reference voltage generator exceeds the reference voltage, a voltage that has an opposite polarity to the voltage of the control pulse is input into the control gate to control the output from the reference voltage generator to approach the reference voltage.

19. A computer readable medium configured for causing a computer to execute the method for setting a reference voltage as set forth in claim 13, the computer configured to control the reference voltage generator.

* * * * *